United States Patent
Masagaki

(10) Patent No.: US 12,464,845 B2
(45) Date of Patent: Nov. 4, 2025

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventor: Atsushi Masagaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/435,461

(22) Filed: Feb. 7, 2024

(65) Prior Publication Data

US 2024/0186354 A1 Jun. 6, 2024

Related U.S. Application Data

(63) Continuation of application No. 17/258,213, filed as application No. PCT/JP2019/021956 on Jun. 3, 2019, now Pat. No. 11,961,862.

(30) Foreign Application Priority Data

Jul. 13, 2018 (JP) .................................. 2018-133271

(51) Int. Cl.
  *H01L 27/146* (2006.01)
  *H10F 39/00* (2025.01)

(52) U.S. Cl.
  CPC ..... *H10F 39/807* (2025.01); *H10F 39/80373* (2025.01); *H10F 39/80377* (2025.01)

(58) Field of Classification Search
  CPC ........... H01L 27/1463; H01L 27/14614; H01L 27/14616; H10F 39/807; H10F 39/80373;

(Continued)

(56) References Cited

U.S. PATENT DOCUMENTS 7,518,172 B2 * 4/2009 Moon ................. H01L 27/1463
                                                                257/292
8,310,003 B2 * 11/2012 Kohyama ......... H01L 27/14614
                                                                257/330

(Continued)

FOREIGN PATENT DOCUMENTS

CN            101621067 A        1/2010
CN            104078475 A       10/2014

(Continued)

OTHER PUBLICATIONS

International Search Report and Written Opinion for International (PCT) Patent Application No. PCT/JP2019/021956, dated Aug. 6, 2019, 5 pages.

(Continued)

*Primary Examiner* — Jarrett J Stark
(74) *Attorney, Agent, or Firm* — Sheridan Ross PC

(57) ABSTRACT

A solid-state imaging element of an embodiment of the present disclosure includes: a semiconductor substrate including a photoelectric conversion section for each pixel; a pixel transistor provided on one surface of the semiconductor substrate; and an element separation section provided in the semiconductor substrate and including a first element separation section and a second element separation section that have mutually different configurations, the element separation section defining an active region of the pixel transistor, in which the second element separation section has, on a side surface, a first semiconductor region and a second semiconductor region that have mutually different impurity concentrations in a depth direction of the second element separation section.

19 Claims, 26 Drawing Sheets

(58) Field of Classification Search
CPC .. H10F 39/80377; H10F 39/014; H10F 39/18; H10F 39/802
See application file for complete search history.

(56) References Cited

U.S. PATENT DOCUMENTS

| | | | |
|---|---|---|---|
| 2001/0012225 A1* | 8/2001 | Rhodes | H01L 27/14643 438/69 |
| 2005/0233494 A1 | 10/2005 | Hong | |
| 2011/0180689 A1* | 7/2011 | Roy | H01L 27/14609 438/73 |
| 2011/0298078 A1 | 12/2011 | Ha et al. | |
| 2013/0049082 A1* | 2/2013 | Kato | H01L 27/14603 257/292 |
| 2013/0221410 A1 | 8/2013 | Ahn | |
| 2014/0054662 A1 | 2/2014 | Yanagita et al. | |
| 2014/0151533 A1* | 6/2014 | Watanabe | H01L 27/14641 257/228 |
| 2014/0291793 A1 | 10/2014 | Tanaka | |
| 2014/0362272 A1 | 12/2014 | Ahn et al. | |
| 2015/0228684 A1 | 8/2015 | Yamashita | |
| 2017/0069672 A1* | 3/2017 | Jin | H01L 27/14614 |
| 2018/0190692 A1 | 7/2018 | Choi et al. | |
| 2019/0378864 A1* | 12/2019 | Innocent | H01L 27/1463 |
| 2021/0118925 A1* | 4/2021 | Zang | H01L 27/14605 |
| 2021/0167104 A1* | 6/2021 | Rao | H01L 27/14689 |
| 2021/0210532 A1* | 7/2021 | Hung | H01L 27/14614 |
| 2021/0272987 A1* | 9/2021 | Masagaki | H01L 27/1463 |
| 2021/0399029 A1* | 12/2021 | Ohura | H01L 27/14634 |
| 2023/0269503 A1* | 8/2023 | Oishi | H01L 27/14636 348/300 |

FOREIGN PATENT DOCUMENTS

| | | |
|---|---|---|
| CN | 104835826 A | 8/2015 |
| JP | 2008091702 A | 4/2008 |
| JP | 2011-253963 | 12/2011 |
| JP | 2014-192348 | 10/2014 |
| JP | 2017-054890 | 3/2017 |
| KR | 10-2010-0004064 | 1/2010 |
| KR | 10-2017-0018206 | 2/2017 |
| KR | 10-2018-0076845 | 7/2018 |
| WO | WO 2012/117931 | 9/2012 |

OTHER PUBLICATIONS

Official Action for U.S. Appl. No. 17/258,213, dated Dec. 13, 2022, 11 pages.
Official Action for U.S. Appl. No. 17/258,213, dated May 15, 2023, 8 pages. Restriction Requirement.
Official Action for U.S. Appl. No. 17/258,213, dated Aug. 2, 2023, 11 pages.
Notice of Allowance for U.S. Appl. No. 17/258,213, dated Nov. 9, 2023, 5 pages.

* cited by examiner

SOLID-STATE IMAGING ELEMENT AND ELECTRONIC APPARATUS

CROSS REFERENCE TO RELATED APPLICATIONS

This application is a continuation of U.S. patent application Ser. No. 17/258,213, filed Jan. 6, 2021, which is a national stage application under 35 U.S.C. 371 and claims the benefit of PCT Application No. PCT/JP2019/021956 having an international filing date of Jun. 3, 2019, which designated the United States, which PCT application claimed the benefit of Japanese Patent Application No. 2018-133271, filed Jul. 13, 2018, the entire disclosures of each of which are incorporated herein by reference.

TECHNICAL FIELD

The present disclosure relates to a solid-state imaging element including an element separation section between pixels, and an electronic apparatus including the solid-state imaging element.

BACKGROUND ART

In a solid-state imaging device such as a CCD (Charge Coupled Device) image sensor and a CMOS (Complementary Metal Oxide Semiconductor) image sensor, a solid-state imaging element is disposed, which includes a photoelectric conversion section for each pixel. For example, in a solid-state imaging element described in PTL 1, there is disclosed, aside from a shallow element separation section (Shallow Trench Isolation: STI) that separates between transistors, a deep element separation section (Deep Trench Isolation: DTI), for example, a structure in which an element separation film is embedded in a trench that penetrates a semiconductor substrate, for optical and electrical separation between pixels.

CITATION LIST

Patent Literature

PTL 1: Japanese Unexamined Patent Application Publication No. 2016-39315

SUMMARY OF THE INVENTION

Incidentally, in a solid-state imaging element, optical and electrical separation between pixels and an improvement in area efficiency are required.

It is desirable to provide a solid-state imaging element and an electronic apparatus that make it possible to improve area efficiency.

A solid-state imaging element according to an embodiment of the present disclosure includes: a semiconductor substrate including a photoelectric conversion section for each pixel; a pixel transistor provided on one surface of the semiconductor substrate; and an element separation section provided in the semiconductor substrate and including a first element separation section and a second element separation section that have mutually different configurations, the element separation section defining an active region of the pixel transistor, in which the second element separation section has, on a side surface, a first semiconductor region and a second semiconductor region that have mutually different impurity concentrations in a depth direction of the second element separation section.

An electronic apparatus according to an embodiment of the present disclosure includes the solid-state imaging element of an embodiment of the present disclosure.

In the solid-state imaging element and the electronic apparatus of the respective embodiments of the present disclosure, the first element separation section and the second element separation section having mutually different configurations are provided in the semiconductor substrate including the photoelectric conversion section for each pixel, and the first element separation section and the second element separation section are used to constitute the element separation section that defines the active region of the pixel transistor. The first semiconductor region and the second semiconductor region having mutually different impurity concentrations are formed on the side surface of the second element separation section in the depth direction. This prevents an area efficiency from being lowered due to provision of a deep element separation section (DTI) for optical and electrical separation between pixels, for example.

In the solid-state imaging element and the electronic apparatus of the respective embodiments of the present disclosure, the active region of the pixel transistor is defined by the first element separation section and the second element separation section that have mutually different configurations, thus preventing the area efficiency from being lowered due to the provision of the deep element separation section (second element separation section) for optical and electrical separation between pixels, for example. Thus, it is possible to provide the solid-state imaging element having the high area efficiency and the electronic apparatus including the solid-state imaging element.

It is to be noted that the effects described here are not necessarily limitative, and may be any of the effects described in the present disclosure.

MODES FOR CARRYING OUT THE INVENTION

Figure 1:
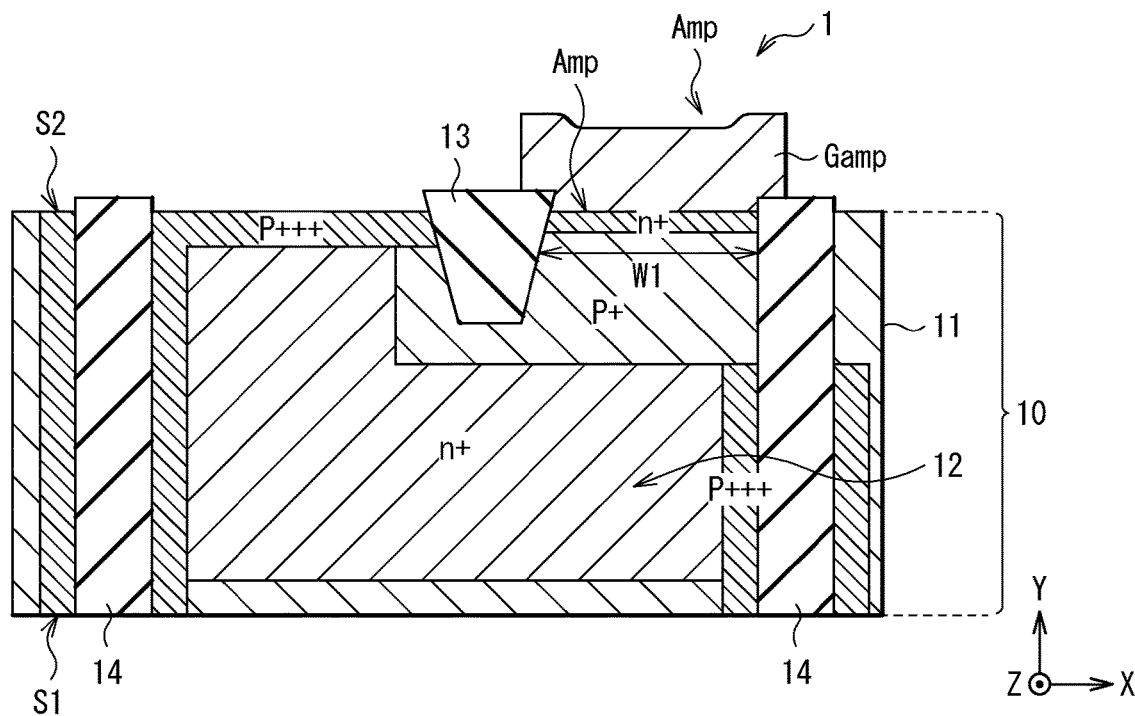
FIG. 1 is a schematic cross-sectional view of a main part of a solid-state imaging element according to a first embodiment of the present disclosure.

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. First Embodiment (An example in which an active region of a pixel transistor is defined by element separation sections of different configurations)
    1-1. Configuration of Solid-State Imaging Element
    1-2. Manufacturing Method of Solid-State Imaging Element
    1-3. Workings and Effects
2. Modification Examples
    2-1. Modification Example 1 (An example in which element separation sections, which define an active region of a pixel transistor, are configured by a p++ region and DTI)
    2-2. Modification Example 2 (An example in which the element separation sections, which define the active region of the pixel transistor, are configured by the p++ region and STI)
    2-3. Modification Example 3 (An example in which element separation sections between adjacent pixels are configured by the STI and the p++ region)
    2-4. Modification Example 4 (An example in which the element separation sections between the adjacent pixels are configured by STI and DTI regions)
    2-5. Modification Example 5 (An example in which a transfer transistor and a photoelectric conversion section are stacked in a vertical direction)
    2-6. Modification Example 6 (Another example of a manufacturing method of the element separation section which defines the active region of the pixel transistor)
3. Second Embodiment (An example in which pixel transistors are parallelized between adjacent pixels)
4. Modification Example
    4-1. Modification Example 7 (An example in which pixel transistors are parallelized between four pixels arranged in 2×2 columns)
5. Application Example (Example of Application to Electronic Apparatus)

1. First Embodiment

1-1. Configuration of Solid-State Imaging Element

Figure 2:
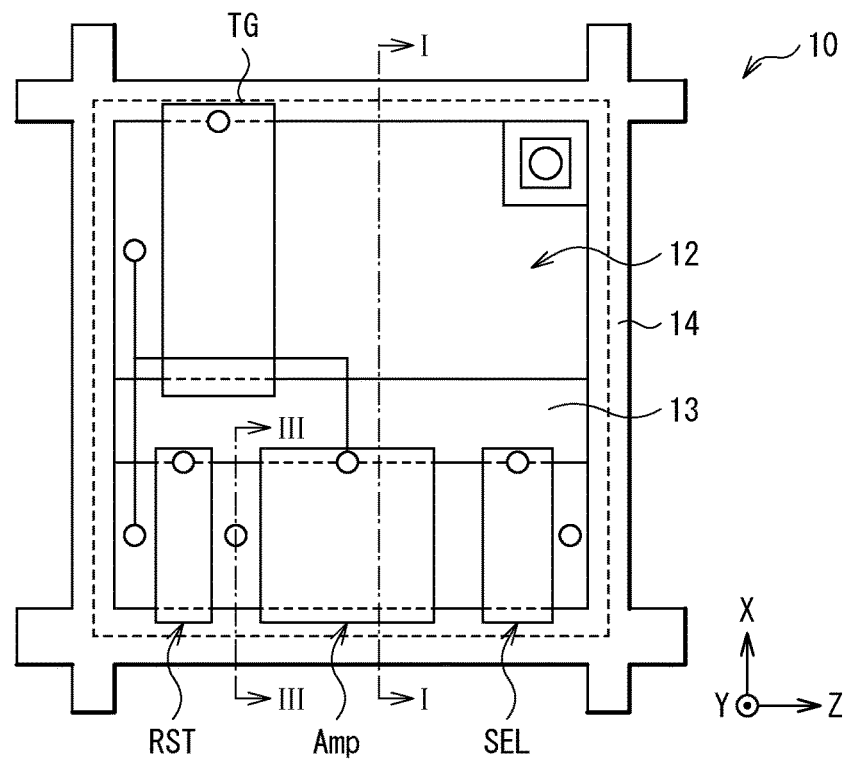
FIG. 2 is a schematic plan view of the solid-state imaging element illustrated in FIG. 1.

FIG. 1 illustrates a cross-sectional configuration of a main part (a light-receiving unit 10) of a solid-state imaging element (a solid-state imaging element 1) according to a first embodiment of the present disclosure. FIG. 2 illustrates a planar configuration of the solid-state imaging element 1 illustrated in FIG. 1. FIG. 1 is a cross-sectional view taken along a line I-I illustrated in FIG. 2. The solid-state imaging element 1 constitutes, for example, one pixel (e.g., a pixel P) in a solid-state imaging device (a solid-state imaging device 100) such as a CCD image sensor or a CMOS image sensor (see FIG. 24). The solid-state imaging element 1 is of a backside illumination type, and has a configuration in which a light condensing part is provided on side of a light incident surface (back surface; a surface S1) of the light-receiving unit 10 including a photoelectric conversion section 12 and in which a wiring layer is provided on side opposite to the light incident surface (front surface; a surface S2), although no illustration thereof is given. In the present embodiment, an active region of various pixel transistors provided in each pixel P has a configuration of being defined by, for example, an element separation section 13 (a first element separation section; STI) that electrically separates various pixel transistors provided in the pixel P, and an element separation section 14 (a second element separation section; DTI) that electrically separates between adjacent pixels.

Hereinafter, description is given of a configuration of the light-receiving unit 10 of the solid-state imaging element 1. It is to be noted that, in the present embodiment, description is given of a case where electrons, out of pairs of electrons and holes generated by photoelectric conversion, are read as signal charges (a case where an n-type semiconductor region is adopted as a photoelectric conversion layer). In addition, in the diagram, "+(plus)" attached to "p" and "n" indicates that p-type or n-type impurity concentration is higher than that of a surrounding p-type semiconductor region or a surrounding n-type semiconductor region.

(Light-Receiving Unit)

The light-receiving unit 10 includes, for example, a semiconductor substrate 11, the photoelectric conversion section 12 embedded in the semiconductor substrate 11 for each pixel P, the element separation section 13 that electrically separates the various pixel transistors provided in the pixel P, and the element separation section 14 that electrically separates between adjacent pixels. In addition, in the light-receiving unit 10, various pixel transistors are arranged on the side of the front surface (surface S1) of the semiconductor substrate 11.

The semiconductor substrate 11 is configured by a p-type silicon (Si) substrate having an impurity concentration in a range from $1 \times 10^{14}/cm^2$ to $1 \times 10/^{20}$ $cm^2$, for example, and includes an n-type semiconductor region (n+) that constitutes a photodiode serving as the photoelectric conversion section 12 in a predetermined region.

In the vicinity of the front surface (surface S2) of the semiconductor substrate 11, there is provided, as a pixel transistor, a transfer transistor (TG) that transfers signal charges generated in the photoelectric conversion section 22 to a vertical signal line Lsig (see FIG. 24), for example. The signal charges may be either electrons or holes generated by photoelectric conversion; here, description is given, exemplifying a case where electrons are read as signal charges. In the vicinity of the surface S2 of the semiconductor substrate 11, there are provided, together with the transfer transistor (TG), for example, a reset transistor (RST), an amplification transistor (Amp), and a selection transistor (SEL), etc. Such a transistor is, for example, a MOSEFT (Metal Oxide Semiconductor Field Effect Transistor), and constitutes a circuit for each pixel P. Each circuit may have, for example, a three-transistor configuration including the transfer transistor (TG), the reset transistor (RST), and the amplification transistor (Amp), or may have a four-transistor configuration including the selection transistor (SEL) in addition thereto.

The photoelectric conversion section 12 is configured by, for example, the n-type semiconductor region (n+) formed in a thickness direction (Y-axis direction) of the semiconductor substrate 11 for each pixel P, and is a photodiode of a p-n junction type with a p-type semiconductor region (p+) provided in the vicinity of the front surface and the back surface of the semiconductor substrate 11. The n-type semiconductor region (n+) is formed, in the semiconductor substrate 11, to partially bend so as to avoid, for example, channel regions of the reset transistor (RST), the amplification transistor (Amp) and the selection transistor (SEL), and to extend so as to reach the vicinity of an interface with respect to the surface S2. In addition, a p-type semiconductor region (p+++) having a higher impurity concentration is formed in a region where the element separation section 14 and the n-type semiconductor region (n+) are close to each other. This allows the photoelectric conversion section 12 to have an increased saturated signal amount as a result of strengthened p-n junction.

In the present embodiment, the active region of each of the pixel transistors such as the transfer transistor (TG), the reset transistor (RST), the amplification transistor (Amp), and the selection transistor (SEL) is defined by the element separation section 13 and the element separation section 14, as described above.

As used herein, the active region of the pixel transistor refers to a region where a gate and source-drain constituting each of the various transistors are formed, for example, as illustrated in FIG. 2. Specifically, a channel region formed between a source and a drain below a gate of each of the various transistors, e.g., an Amp channel region formed below a gate GAmp of the amplification transistor (Amp) has a channel length (W) which is configured to be defined by the element separation section 13 and the element separation section 14, as illustrated in FIG. 1.

The element separation section 13 is a so-called STI provided between the pixel transistors, e.g., between the transfer transistor (TG) and each of the reset transistor (RST), the amplification transistor (Amp), and the selection transistor (SEL), and is configured by, for example, $SiO_2$ in the pixel P.

The element separation section 14 is a so-called DTI provided between adjacent pixels, and is provided to surround the pixel P, for example. The element separation section 14 is formed deeper in the thickness direction (Y-axis direction) of the semiconductor substrate 11 as compared with the element separation section 13 that separates between the pixel transistors, and is formed by penetrating, for example, the semiconductor substrate 11 from the front surface (surface S2) to the back surface (surface S1).

In the present embodiment, as described above, the p-type semiconductor region (p+++) having a higher impurity concentration is formed on a side surface between the n-type semiconductor region (n+) and the element separation section 14 close to each other. The impurity concentration of the p+++ region is preferably in a range from $1 \times 10^{17}/cm^2$ to $1 \times 10^{20}/cm^2$. As described above, the n-type semiconductor region (n+) is formed to partially bend so as to avoid the channel regions of the reset transistor (RST), the amplification transistor (Amp) and the selection transistor (SEL), and to extend so as to reach the vicinity of the interface with respect to the surface S1. That is, as for the p-type semiconductor region (hereinafter, referred to as the p+++ region) having a higher impurity concentration, the element separation section 14 not being in contact with the channel regions of the reset transistor (RST), the amplification transistor (Amp) and the selection transistor (SEL) is provided with the p+++ region formed on the entire side surface thereof. Meanwhile, the element separation section 14 being in contact with the channel regions of the reset transistor (RST), the amplification transistor (Amp) and the selection transistor (SEL) is provided with the p+++ region (second semiconductor region) selectively formed on a side surface close to the n-type semiconductor region (n+) except the vicinity of the channel regions. This allows the photoelectric conversion section 12 to have an improved saturated signal amount as a result of strengthened p-n junction without impairing pixel transistor characteristics.

In addition, in the present embodiment, the region (first semiconductor region), in the vicinity of the channel regions, except the side surface of the element separation section 14 close to the n-type semiconductor region (n+) is set as the p-type semiconductor region (p+) having a normal impurity concentration, and thus a distance between the p+++ region and the channel region of the pixel transistor is sufficiently secured. This makes it possible to prevent deterioration or the like of dark current characteristics caused by a leakage current or the like due to a strong electric field. It is to be noted that the p+++ region is formed to extend on the front surface (surface S2) of the semiconductor substrate 11 from the side surface of the element separation section 14 not being in contact with the channel regions of the pixel transistors to the element separation section 13.

In addition, as described above, the solid-state imaging element 1 has a configuration in which the light condensing part is provided on the side of the light incident surface (back surface; surface S1) of the light-receiving unit 10 and in which the wiring layer is provided on the side opposite to the light incident surface side (front surface; surface S2).

The light condensing part has a configuration in which an on-chip lens and a color filter are stacked to face each other in the photoelectric conversion section 12 of each pixel P as optical function layers on light incident side (surface S1 side). For example, a light-shielding film may be disposed between the pixels. The wiring layer has a plurality of wiring lines with, for example, an interlayer insulating film interposed therebetween.

It is to be noted that there may be formed, between the light-receiving unit 10 and the light condensing part, a protective film including, for example, a fixed charge film including hafnium oxide ($HfO_2$), zirconium oxide ($ZrO_2$), aluminum oxide ($Al_2O_3$), titanium oxide ($TiO_2$) and tantalum oxide ($Ta_2O_5$), etc., for example, a monolayer film such as silicon nitride ($Si_2N_3$), silicon oxide ($SiO_2$) and silicon oxynitride (SiON), or a stacked film thereof.

1-2. Manufacturing Method of Solid-State Imaging Element

The element separation section 14 of the solid-state imaging element 1 of the present embodiment may be manufactured, for example, as follows.

Figure 3A:
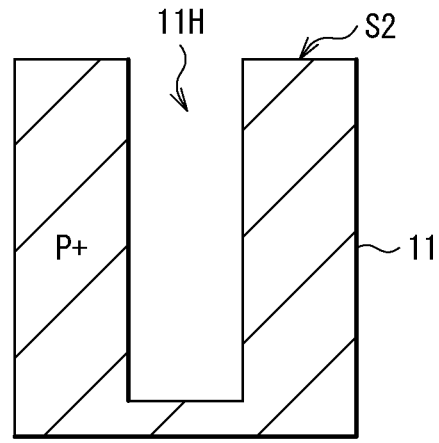
FIG. 3A is an explanatory schematic cross-sectional view of an example of a manufacturing step of an element separation section of the solid-state imaging element illustrated in FIG. 1.
Figure 3B:
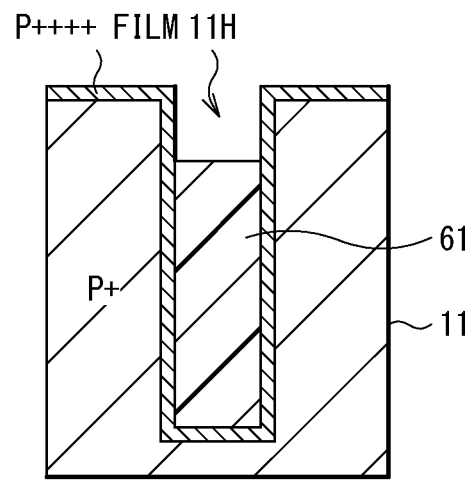
FIG. 3B is a schematic cross-sectional view of a step subsequent to FIG. 3A.

First, for example, an Si substrate is used as the semiconductor substrate 11, and a p-type impurity semiconductor region (p-well, p+) is formed in an Si substrate by ion implantation; thereafter, a trench 11H is formed that serves as the element separation section 14 by etching. Subsequently, as illustrated in FIG. 3B, after forming a p++++ film on a front surface of the Si substrate and a side surface and a bottom surface of the trench 11H, a resist film 61 is applied all over to fill the inside of the trench 11H, and anisotropic etching is used to remove the resist film 61 to a predetermined height in the trench 11H.

Figure 3C:
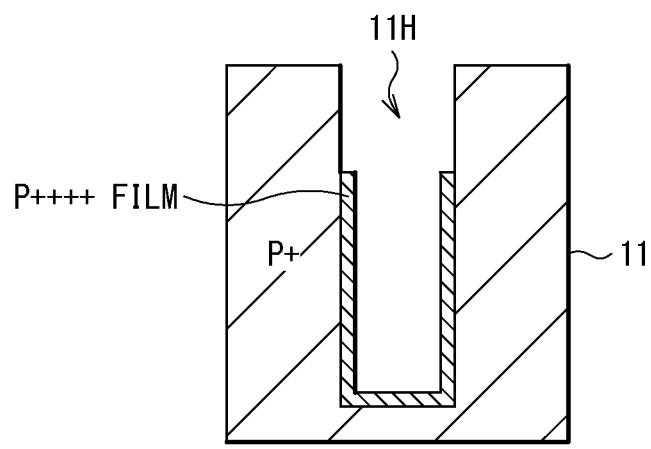
FIG. 3C is a schematic cross-sectional view of a step subsequent to FIG. 3B.
Figure 3D:
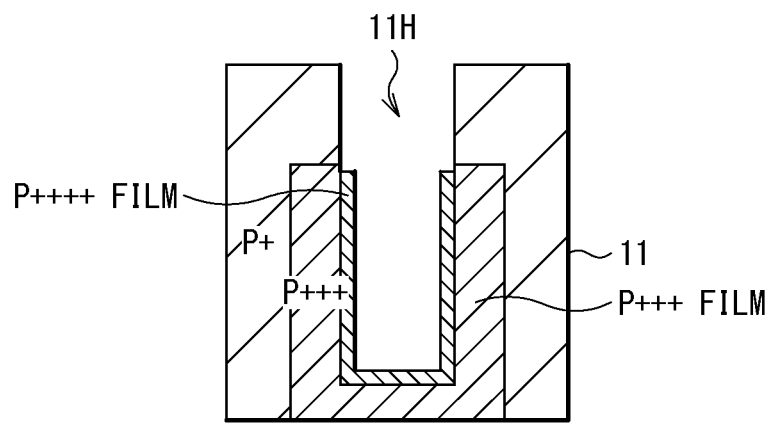
FIG. 3D is a schematic cross-sectional view of a step subsequent to FIG. 3C.
Figure 3E:
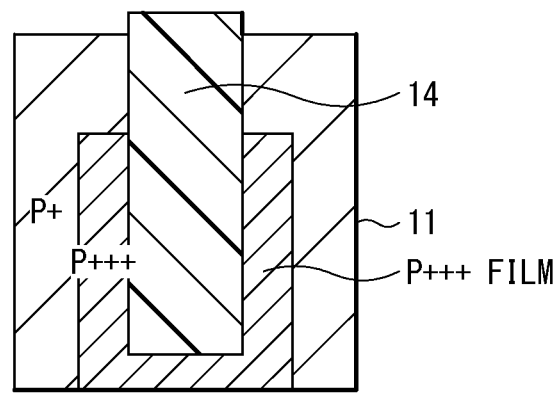
FIG. 3E is a schematic cross-sectional view of a step subsequent to FIG. 3D.

Next, as illustrated in FIG. 3C, the p++++ film exposed from the resist film 61 is etched using, for example, wet etching to remove the p++++ film on the front surface of the Si substrate and in the upper part of the trench 11H. Subsequently, as illustrated in FIG. 3D, the P++++ film is diffused into the Si substrate by heating to form the p+++ region. Finally, as illustrated in FIG. 3E, the p++++ film is removed, and the trench is filled with, for example, an $SiO_2$ film to thereby form the element separation section 14.

(Operation of Solid-State Imaging Element)

In the solid-state imaging element 1 of the present embodiment, for example, signal charges (here, electrons) are acquired as the pixel P of the solid-state imaging device 100, as follows. When light enters the solid-state imaging element 1 via the on-chip lens, the light passes through the color filter or the like to be detected (absorbed) by the photoelectric conversion section 12 in each pixel P, and color light of red, green or blue is photoelectrically converted. Out of electron-hole pairs generated in the photoelectric conversion section 12, electrons are moved to and accumulated in the semiconductor substrate 11 (e.g., the n-type semiconductor region in the Si substrate), whereas holes are moved to the p-type semiconductor region and discharged.

1-3. Workings and Effects

Figure 4:
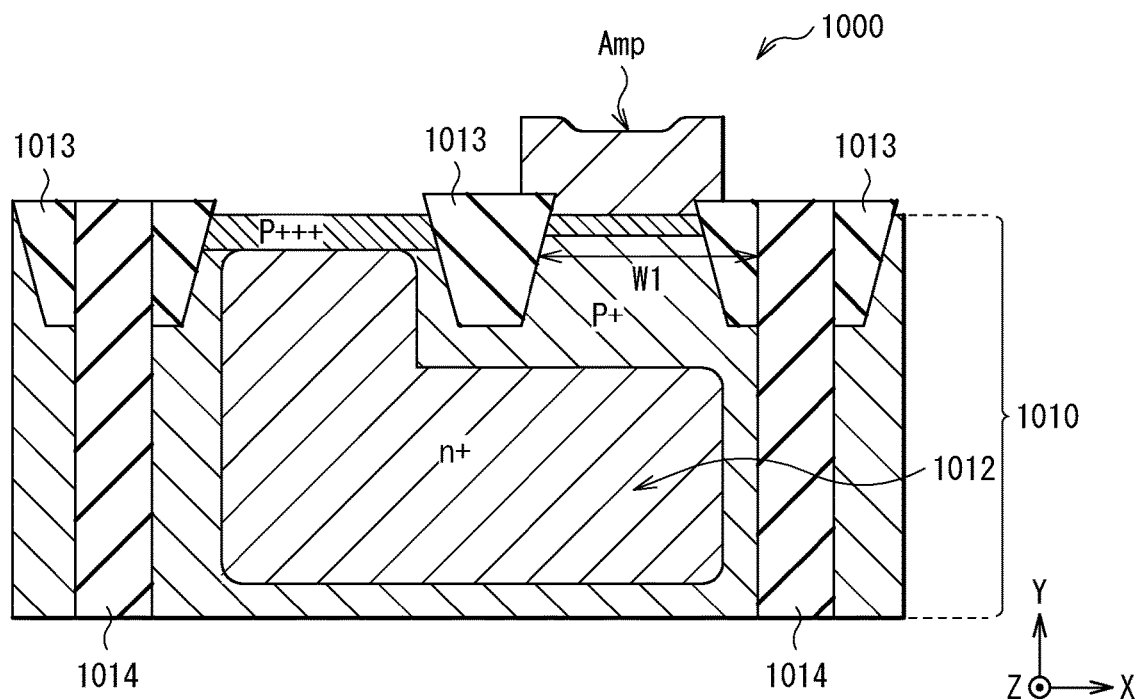
FIG. 4 is a schematic cross-sectional view of a main part of a typical solid-state imaging element.
Figure 5:
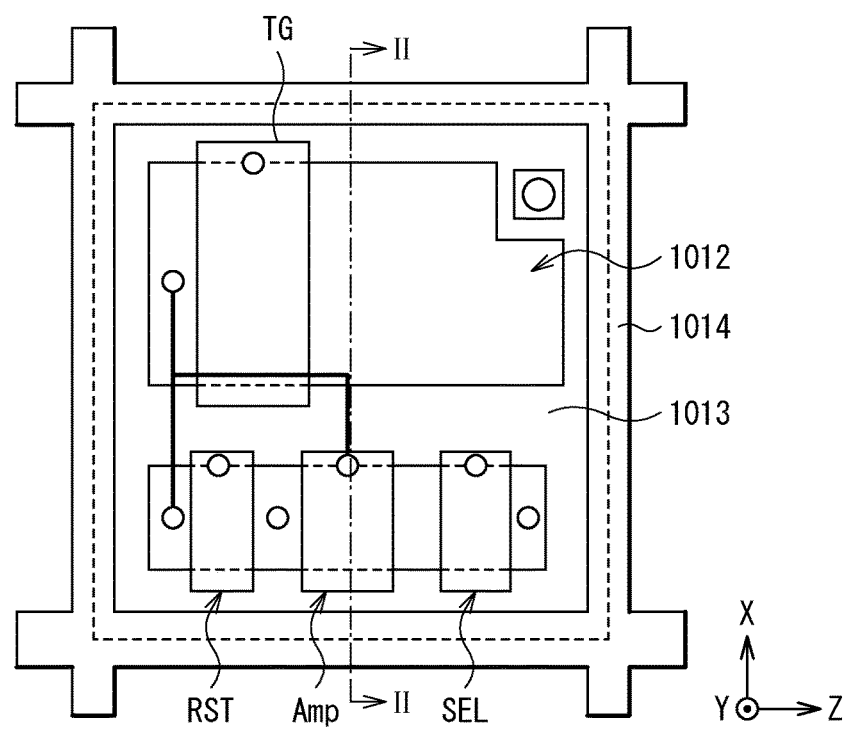
FIG. 5 is a schematic plan view of the typical solid-state imaging element illustrated in FIG. 4.

FIG. 4 schematically illustrates a cross-sectional configuration of a main part (light-receiving unit 10) of a typical solid-state imaging element 1000, and FIG. 5 schematically illustrates a planar configuration of the solid-state imaging element 1000 illustrated in FIG. 4. It is to be noted that FIG. 4 is a cross-sectional view taken along a line II-II illustrated in FIG. 5. As described above, the solid-state imaging element (e.g., the solid-state imaging element 1000) including a photoelectric conversion section 1012 for each pixel employs a structure of forming a deep element separation section 1014 (DTI) between pixels, aside from a shallow element separation section 1013 (STI) that electrically separates between transistors provided in a pixel, for optical and electrical separation between the pixels. However, in a case where the element separation section 1014 is formed, as illustrated in FIGS. 4 and 5, an issue arises in which a pixel size allowing arrangement of effective elements becomes smaller due to the formation of the element separation section 1014, thus lowering an area efficiency.

In contrast, in the present embodiment, the element separation section that defines the active region of the pixel transistor provided in the pixel P is configured by the element separation section 13 that electrically separates the various pixel transistors and the element separation section 14 that electrically separates between the adjacent pixels. As described above, this makes it possible to prevent the area efficiency from being lowered due to the provision of the deep element separation section (DTI) for optical and electrical separation between pixels.

As described above, in the solid-state imaging element 1 of the present embodiment, the active region of the pixel transistor provided in the pixel P is defined by the element separation section 13 that electrically separates the various pixel transistors and the element separation section 14 that electrically separates between the adjacent pixels. This makes it possible to prevent the area efficiency from being lowered due to the provision of the element separation section 14 corresponding to the above-described DTI. Thus, it becomes possible to provide the solid-state imaging element 1 having a high area efficiency and the solid-state imaging device 100 including the solid-state imaging element 1.

In addition, in the present embodiment, the p+++ region having a higher impurity concentration is formed at a lower part of the element separation section 14 that defines the active region of the pixel transistor, specifically, in a region close to the n-type semiconductors region (n+) constituting the photoelectric conversion section 12. This enables electrons caused by an interface state or the like of the element separation section 14 to be recombined to prevent leakage to the photoelectric conversion section 12; in addition, the strengthened p-n junction with the n-type semiconductor region (n+) constituting the photoelectric conversion section 12 enables a saturated signal amount to be increased to improve sensor characteristics.

Figure 6:
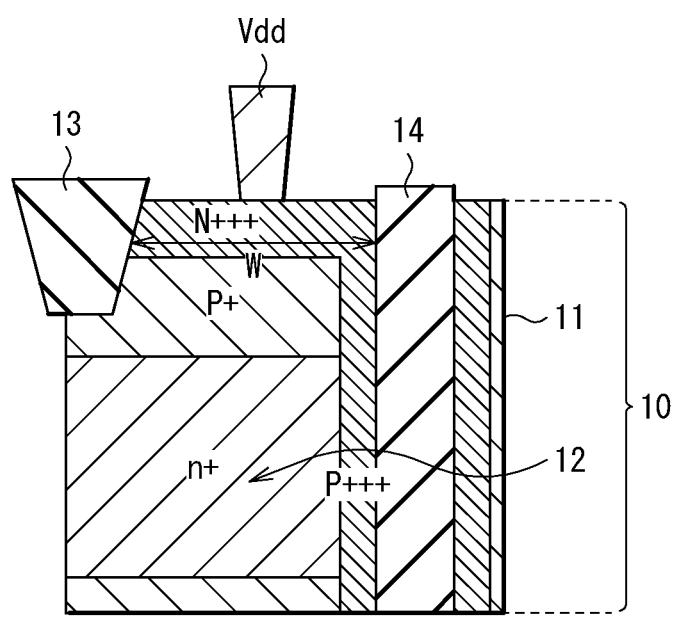
FIG. 6 is a schematic cross-sectional view taken along a line III-III illustrated in FIG. 2.

Further, in the present embodiment, a region around the channel region of the pixel transistor is set, with respect to the p+++ region, as the normal p-type semiconductor region (p+) having a lower impurity concentration than that of the p+++ region provided in the vicinity of the n-type semiconductor region (n+) of the element separation section 14 defining the active region of the pixel transistor. FIG. 6 illustrates a cross-sectional configuration corresponding to a line III-III illustrated in FIG. 1. As illustrated in FIG. 6, for example, in a case where the p+++ region is formed on the entire side surface of the element separation section 14 defining the active region of the pixel transistor, for example, the n-type semiconductor region (hereinafter, referred to as an n+++ region) constituting source-drain of the reset transistor (RST) and the amplification transistor (Amp) and the p+++ region come into contact. There is a possibility that this may generate a strong electric field between the n+++ region and the p+++ region. In addition, the p-type impurity concentration in the p+++ region is high, and thus the p-type impurities diffuse, leading to a possibility that the active region (channel length W) defined by the element separation section 13 and the element separation section 14 may be shortened. Therefore, as in the present embodiment, sufficiently securing the distance between the p+++ region and the channel region of the pixel transistor makes it possible to prevent deterioration or the like of the dark current characteristics due to a strong electric field.

Hereinafter, description is given of modification examples (Modification Examples 1 to 7) and a second embodiment of the present disclosure. It is to be noted that the same components as those of the foregoing first embodiment are denoted by the same reference numerals, and descriptions thereof are omitted.

2. Modification Examples

2-1. Modification Example 1

Figure 7:
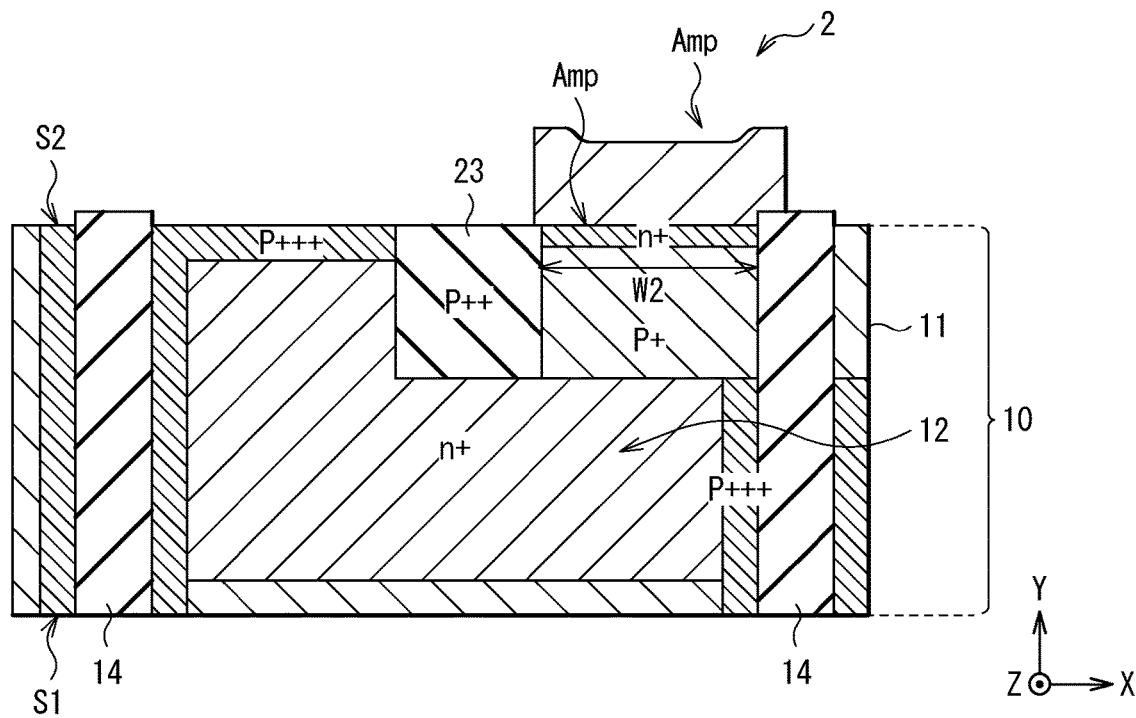
FIG. 7 is a schematic cross-sectional view of a main part of a solid-state imaging element according to Modification Example 1 of the present disclosure.
Figure 8:
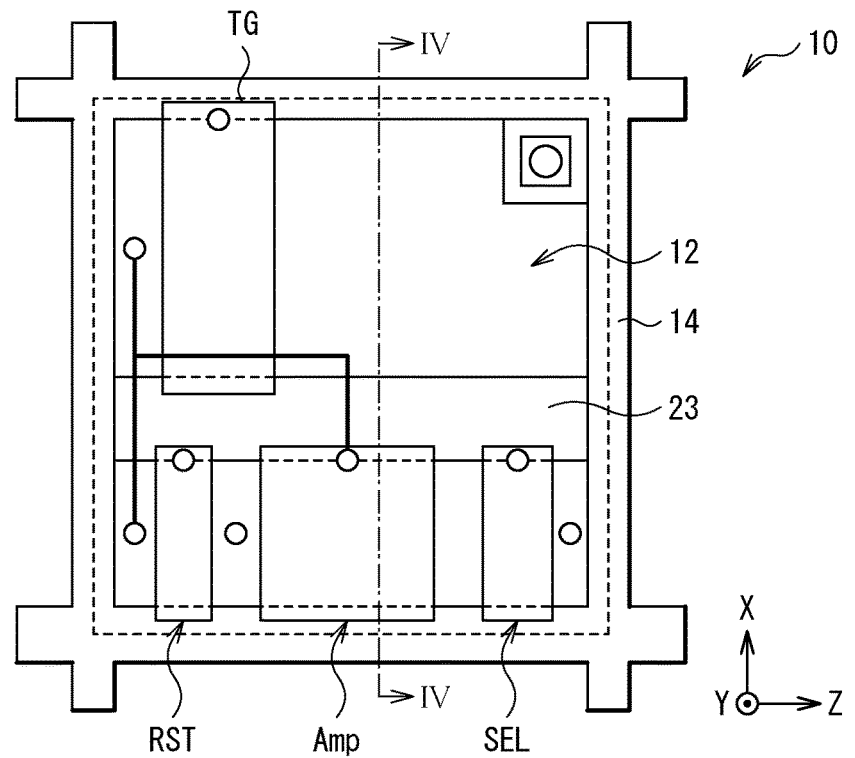
FIG. 8 is a schematic plan view of the solid-state imaging element illustrated in FIG. 7.

FIG. 7 illustrates a cross-sectional configuration of a main part (light-receiving unit 10) of a solid-state imaging element (a solid-state imaging element 2) according to Modification Example 1 of the present disclosure. FIG. 8 illustrates a planar configuration of the solid-state imaging element 2 illustrated in FIG. 7. FIG. 7 is a cross-sectional view taken along a line IV-IV illustrated in FIG. 8. In the solid-state imaging element 2 of the present modification example, an element separation section 23 is configured by a p-type semiconductor region (p++).

The p-type semiconductor region constituting the element separation section 23 has an impurity concentration that is higher than a p-type impurity concentration of the entire semiconductor substrate 11, and has an impurity concentration that is lower than that of the p-type semiconductor region (p+++ region) with high concentration formed on the side surface of the element separation section 14. Specifically, the impurity concentration of the element separation section 23 is preferably in a range from $1\times10^{16}/cm^2$ to $1\times10^{18}/cm^2$, for example. This suppresses formation of an inversion layer below a gate when a gate potential is turned on, thus enabling use for element separation.

2-2. Modification Example 2

Figure 9:
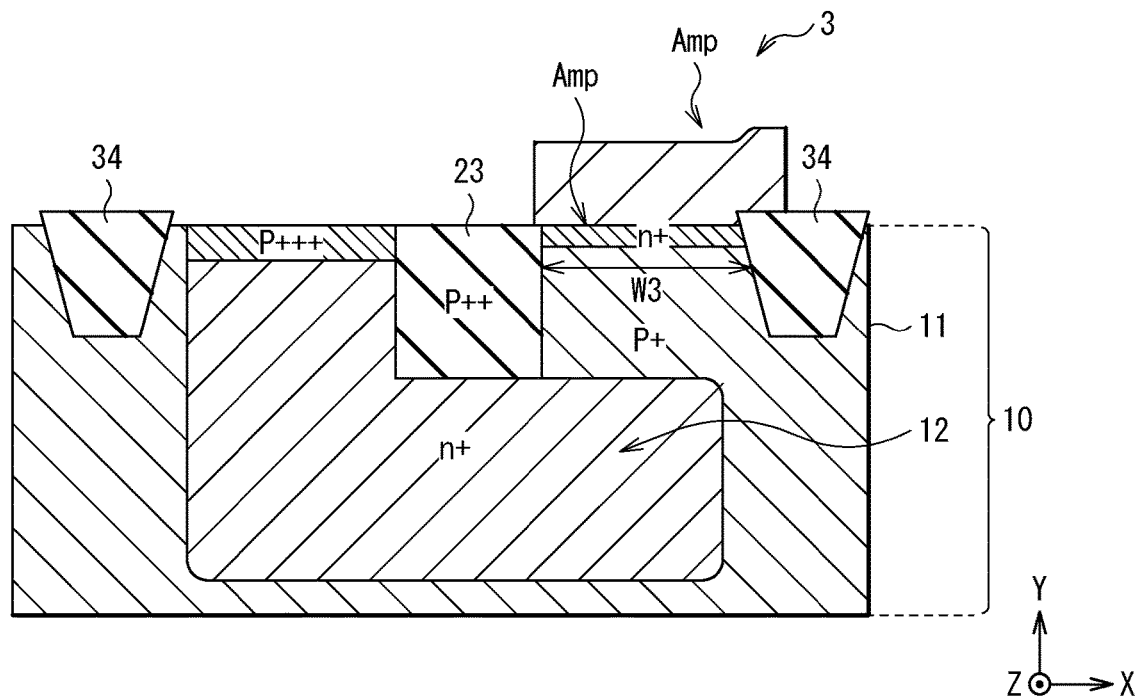
FIG. 9 is a schematic cross-sectional view of a main part of a solid-state imaging element according to Modification Example 2 of the present disclosure.
Figure 10:
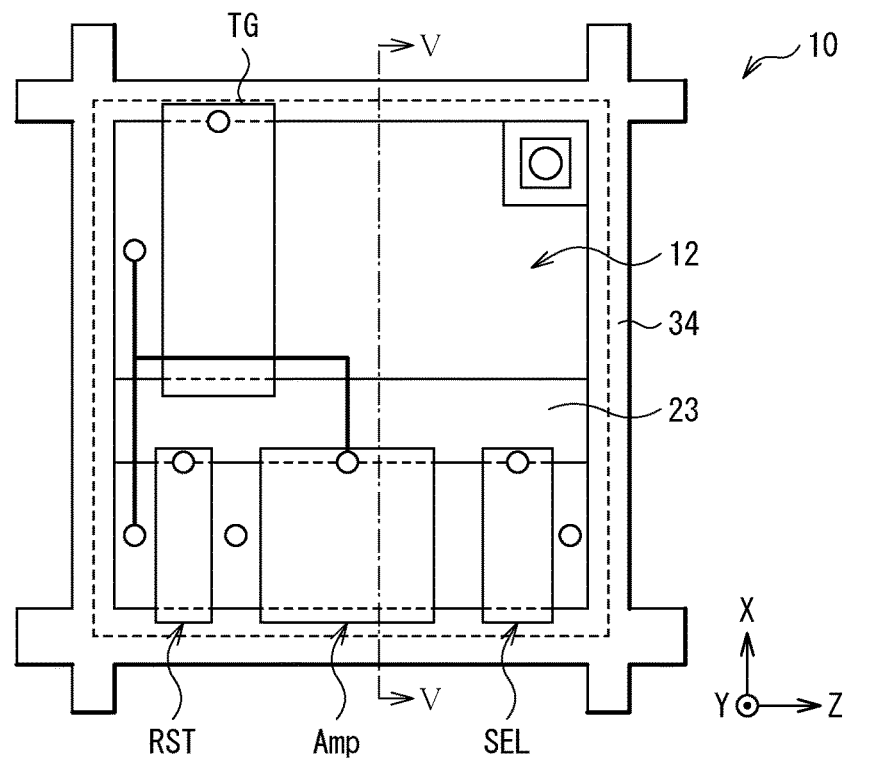
FIG. 10 is a schematic plan view of the solid-state imaging element illustrated in FIG. 9.

FIG. 9 illustrates a cross-sectional configuration of a main part (light-receiving unit 10) of a solid-state imaging element (a solid-state imaging element 3) according to Modification Example 2 of the present disclosure. FIG. 10 illustrates a planar configuration of the solid-state imaging element 3 illustrated in FIG. 9. FIG. 9 is a cross-sectional view taken along a line V-V illustrated in FIG. 10. The solid-state imaging element 3 of the present modification example has a configuration in which the element separation section 23 is configured by the p-type semiconductor region (p++) similarly to the foregoing Modification Example 1 and in which an element separation section 34 is configured by the STI.

2-3. Modification Example 3

Figure 11:
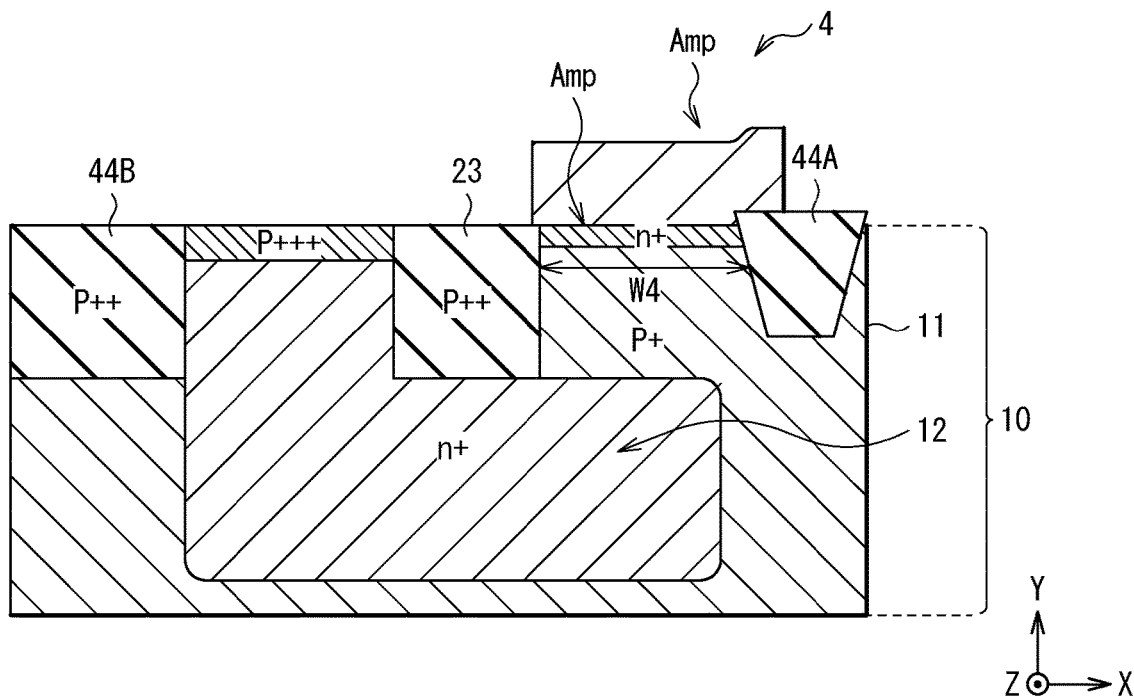
FIG. 11 is a schematic cross-sectional view of a main part of a solid-state imaging element according to Modification Example 3 of the present disclosure.
Figure 12:
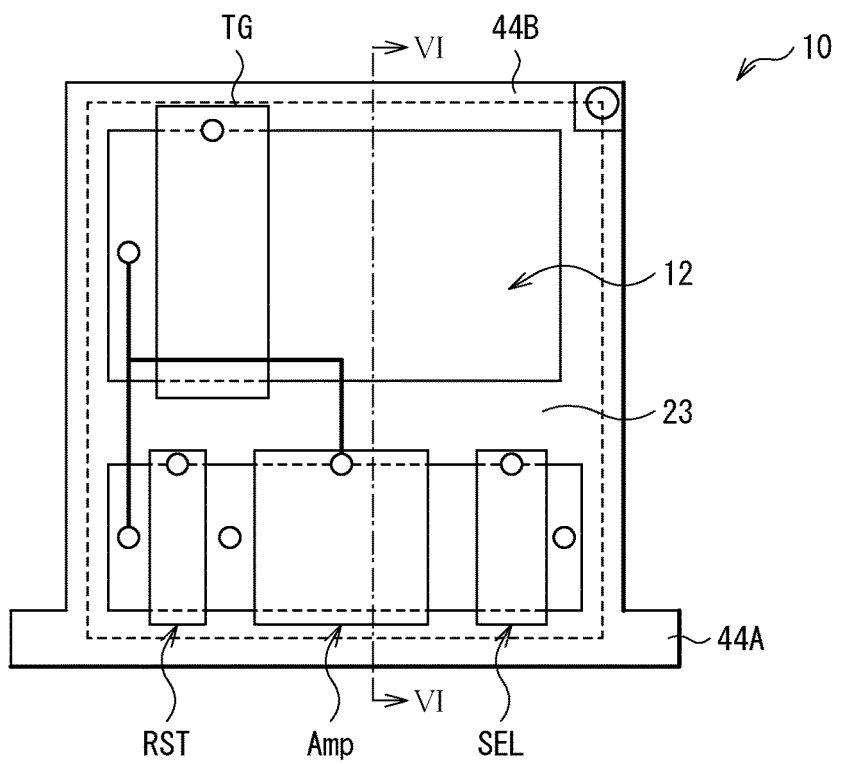
FIG. 12 is a schematic plan view of the solid-state imaging element illustrated in FIG. 116.

FIG. 11 illustrates a cross-sectional configuration of a main part (light-receiving unit 10) of a solid-state imaging element (a solid-state imaging element 4) according to Modification Example 3 of the present disclosure. FIG. 12 illustrates a planar configuration of the solid-state imaging element 4 illustrated in FIG. 11. FIG. 11 is a cross-sectional view taken along a line VI-VI illustrated in FIG. 12. In the solid-state imaging element 4 of the present modification example, the element separation section 23 is configured by the p-type semiconductor region (p++) similarly to the foregoing Modification Example 1, and an element separation section 44A, of an element separation section 44, which defines the active region of the pixel transistor together with the element separation section 23 is configured by the STI, and an element separation section 44B in another region is configured by the p-type semiconductor region (p++).

In the solid-state imaging element 4 of the present modification example, there is no need to etch a part being in contact with the n-type semiconductor region constituting the photoelectric conversion section 12, thus making it possible to reduce generation of a dark current due to damage of the etching.

2-4. Modification Example 4

Figure 13A:
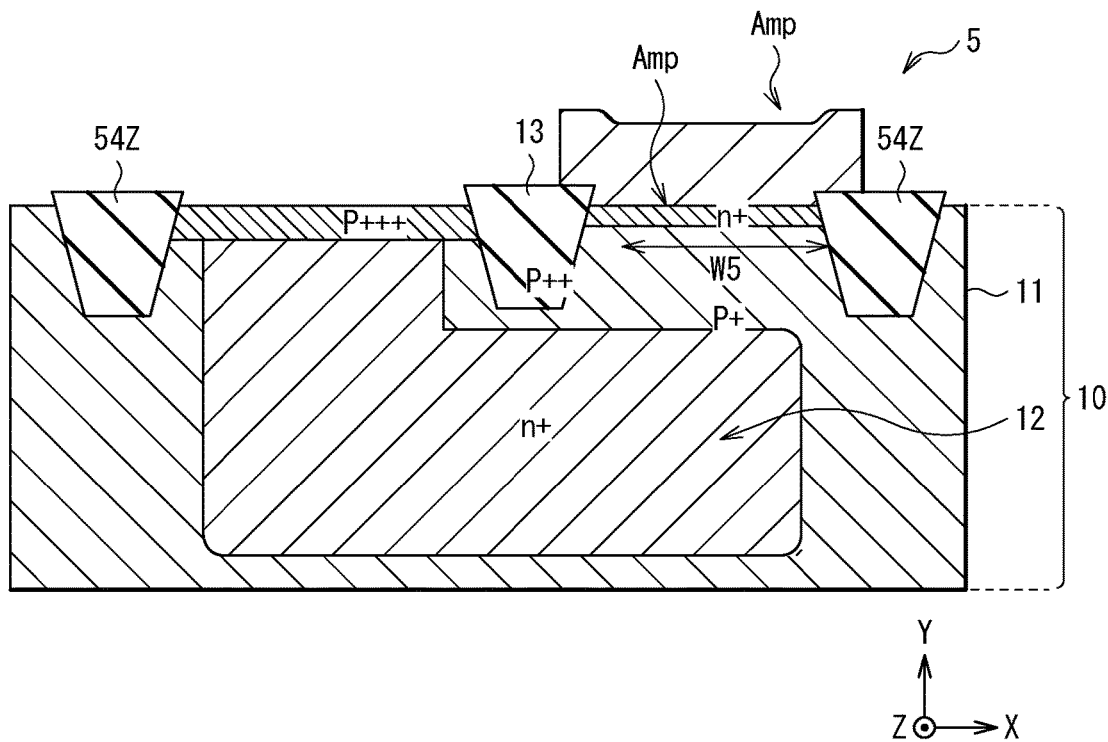
FIG. 13A is one schematic cross-sectional view of a main part of a solid-state imaging element according to Modification Example 4 of the present disclosure.
Figure 13B:
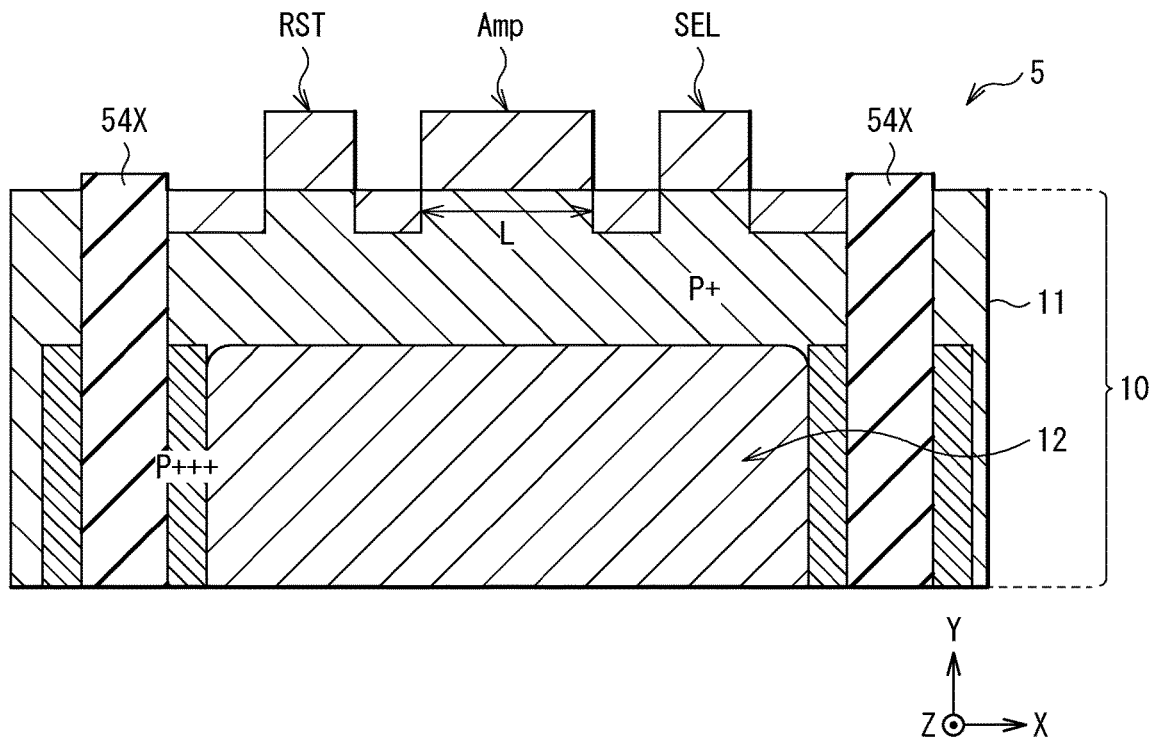
FIG. 13B is another schematic cross-sectional view of the main part of the solid-state imaging element according to Modification Example 4 of the present disclosure.
Figure 14:
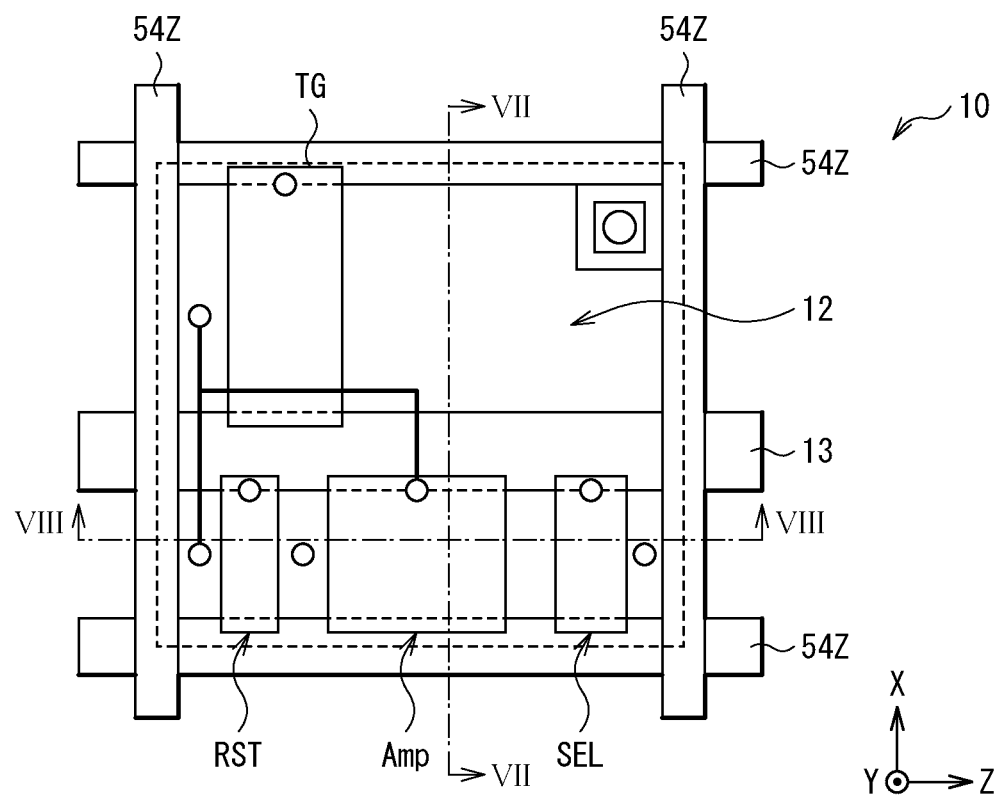
FIG. 14 is a schematic plan view of the solid-state imaging element illustrated in FIGS. 13A and 13B.

FIG. 13A illustrates one cross-sectional configuration of a main part (light-receiving unit 10) of a solid-state imaging element (a solid-state imaging element 5) according to Modification Example 4 of the present disclosure, and FIG. 13B illustrates another cross-sectional configuration of the light-receiving unit 10 of the solid-state imaging element 5. FIG. 14 illustrates a planar configuration of the solid-state imaging element 5 illustrated in FIGS. 13A and 13B. It is to be noted that FIG. 13A is a cross-sectional view taken along a line VII-VII illustrated in FIG. 14, and FIG. 13B is a cross-sectional view taken along a line VIII-VIII illustrated in FIG. 14. The solid-state imaging element 5 of the present modification example has a configuration in which a part, of an element separation section 54, extending in an X-axis direction is formed by the STI similarly to the foregoing first embodiment and in which a part extending in a Z-axis direction is formed by the STI. In this manner, the element separation section provided between adjacent pixels may have different configurations in the X-axis direction and in the Y-axis direction.

2-5. Modification Example 5

Figure 15:
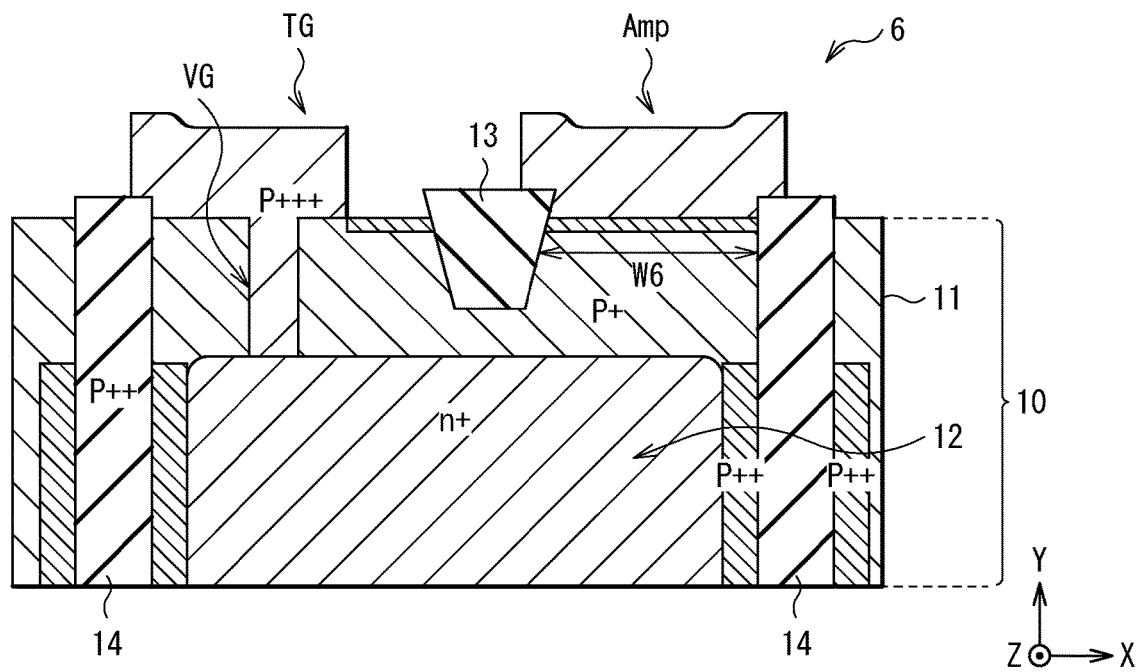
FIG. 15 is a schematic cross-sectional view of a main part of a solid-state imaging element according to Modification Example 5 of the present disclosure.
Figure 16:
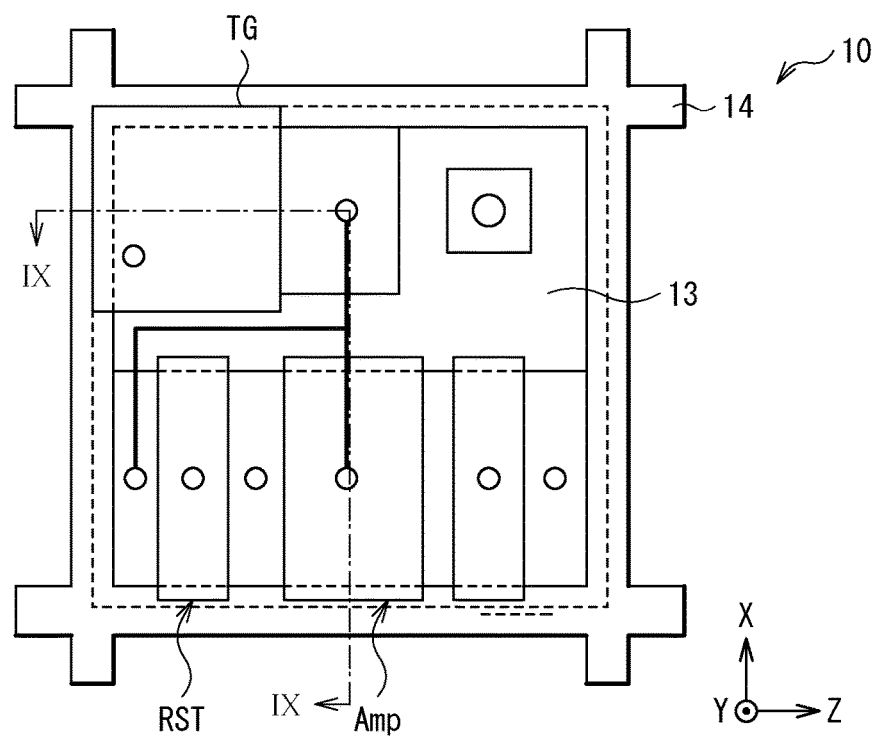
FIG. 16 is a schematic plan view of the solid-state imaging element illustrated in FIG. 15.

FIG. 15 illustrates a cross-sectional configuration of a main part (light-receiving unit 10) of a solid-state imaging element (a solid-state imaging element 6) according to Modification Example 5 of the present disclosure. FIG. 16 illustrates a planar configuration of the solid-state imaging element 6 illustrated in FIG. 15. FIG. 15 is a cross-sectional view taken along a line IX-IX illustrated in FIG. 16. In the solid-state imaging element 6 of the present modification example, the n-type semiconductor region (n+) constituting the photoelectric conversion section 12 is formed only on the side of the back surface (surface Si) of the semiconductor substrate 11. This makes it possible to further improve the area efficiency of the pixel transistor in the pixel P. It is to be noted that, in this structure, it is preferable to electrically couple the transfer transistor (TG) and the photoelectric conversion section 12 using an embedded transfer electrode VG.

2-6. Modification Example 6

FIGS. 17A to 17E are each a schematic cross-sectional view of another example of the manufacturing steps of the element separation section 14 of the solid-state imaging element 1 according to Modification Example 6 of the present disclosure in the order of the steps.

Figure 17A:
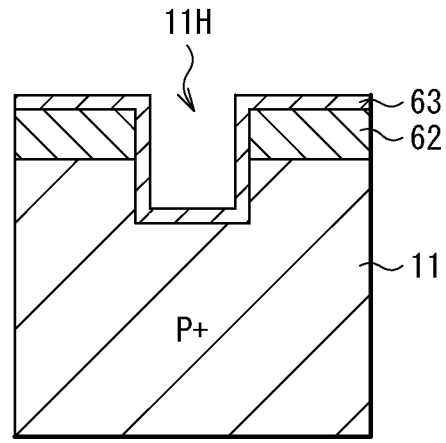
FIG. 17A is an explanatory schematic cross-sectional view of an example of a manufacturing step of an element separation section of the solid-state imaging element illustrated in FIG. 1 as Modification Example 6 of the present disclosure.

First, for example, an Si substrate is used as the semiconductor substrate 11, and a p-type impurity semiconductor region (p-well) is formed in the Si substrate by ion implantation; thereafter, as illustrated in FIG. 17A, a hard mask 62 is formed on the Si substrate, and the Si substrate is etched to form an opening 11H1. Thereafter, for example, an $SiO_2$ film 63 is formed on a front surface of the hard mask 62 and on a side surface and a bottom surface of the opening 11H1.

Figure 17B:
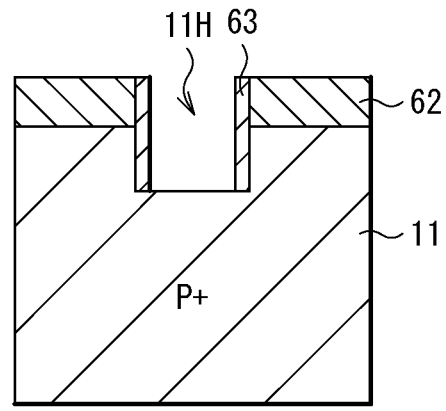
FIG. 17B is a schematic cross-sectional view of a step subsequent to FIG. 17A.
Figure 17C:
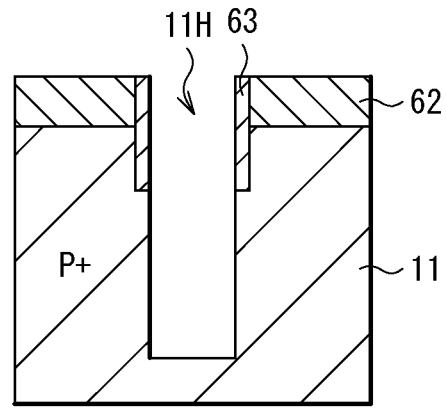
FIG. 17C is a schematic cross-sectional view of a step subsequent to FIG. 17B.
Figure 17D:
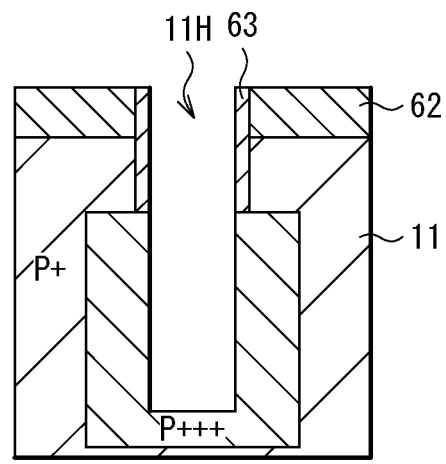
FIG. 17D is a schematic cross-sectional view of a step subsequent to FIG. 17C.
Figure 17E:
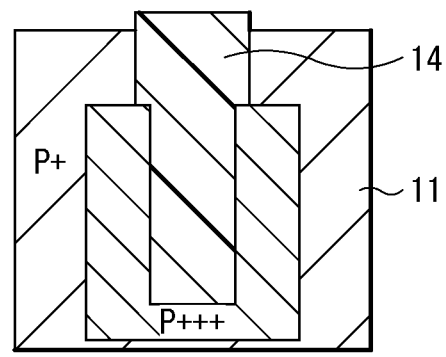
FIG. 17E is a schematic cross-sectional view of a step subsequent to FIG. 17D.

Subsequently, as illustrated in FIG. 17B, the $SiO_2$ film 63 provided on the hard mask 62 and on the bottom surface of the opening 11H1 is selectively etched by anisotropic etching to leave the $SiO_2$ film 63 only on the side surface of the opening 11H1. Next, as illustrated in FIG. 17C, the Si substrate is further etched using the hard mask 62 to form the trench 11H that constitutes the element separation section 14. Subsequently, as illustrated in FIG. 17D, p-type impurities are diffused into the trench 11H using, for example, gas phase diffusion or plasma doping to form the p+++ region. Finally, as illustrated in FIG. 17E, the trench is filled with the $SiO_2$ film, for example, to thereby form the element separation section 14.

3. Second Embodiment

Figure 18:
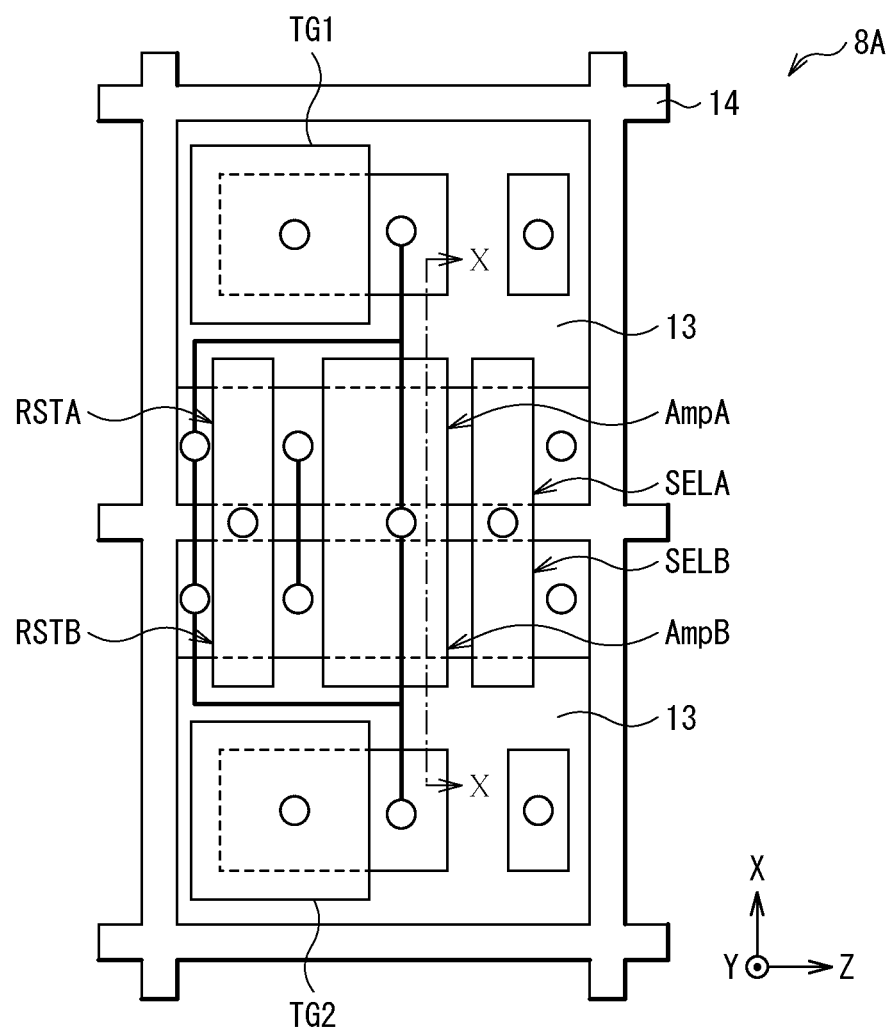
FIG. 18 is a schematic plan view of one example of a solid-state imaging element according to a second embodiment of the present disclosure.
Figure 19:
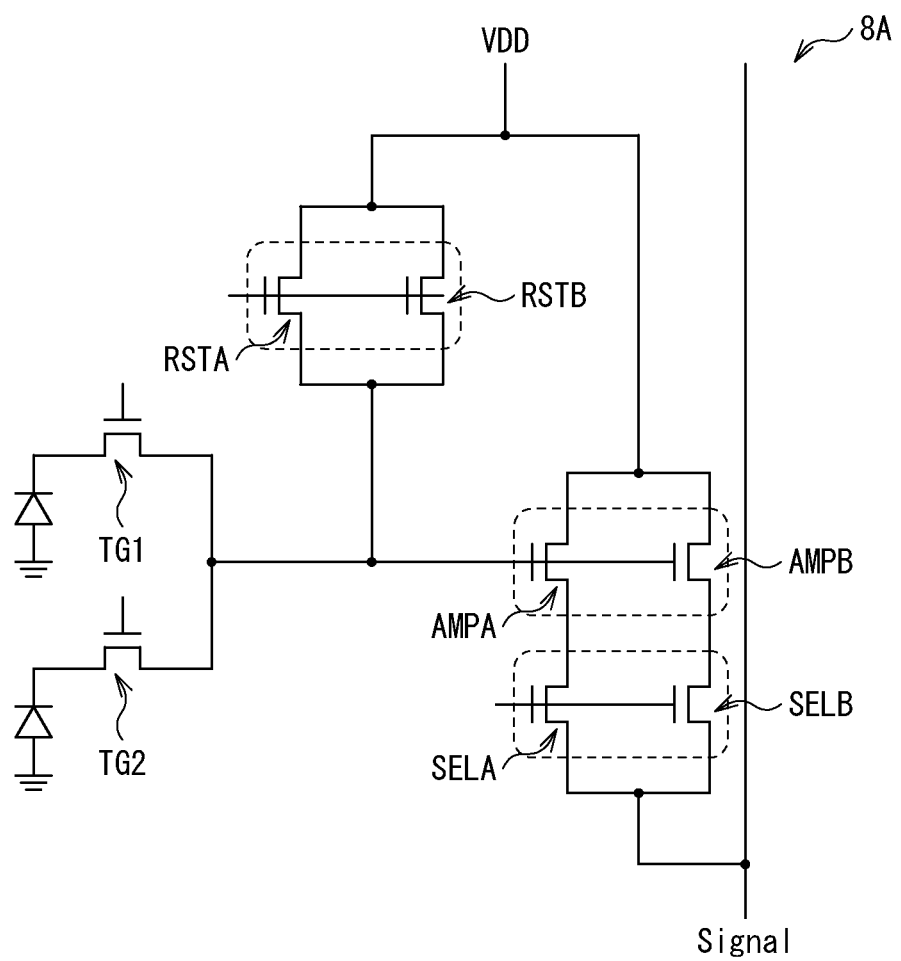
FIG. 19 is an equivalent circuit diagram of the solid-state imaging element illustrated in FIG. 18.

FIG. 18 schematically illustrates a planar configuration of a solid-state imaging element (a solid-state imaging element 8A) according to the second embodiment of the present disclosure. FIG. 19 illustrates an equivalent circuit of the solid-state imaging element 8A illustrated in FIG. 18. As in the solid-state imaging element 1 described in the foregoing first embodiment, in a case where the active regions of the pixel transistors such as the reset transistor (RST), the amplification transistor (Amp) and the selection transistor (SEL) are defined by the element separation section 13 and the element separation section 14, it is preferable that the pixel transistors be arranged in parallel between adjacent pixels, and gates of the respective pixel transistors be shared between the pixels to parallelize the pixel transistors between the adjacent pixels, as in the present embodiment. In the present embodiment, the reset transistor (RST), the amplification transistor (Amp) and the selection transistor (SEL) are configured to be parallelized between the adjacent pixels.

Figure 20:
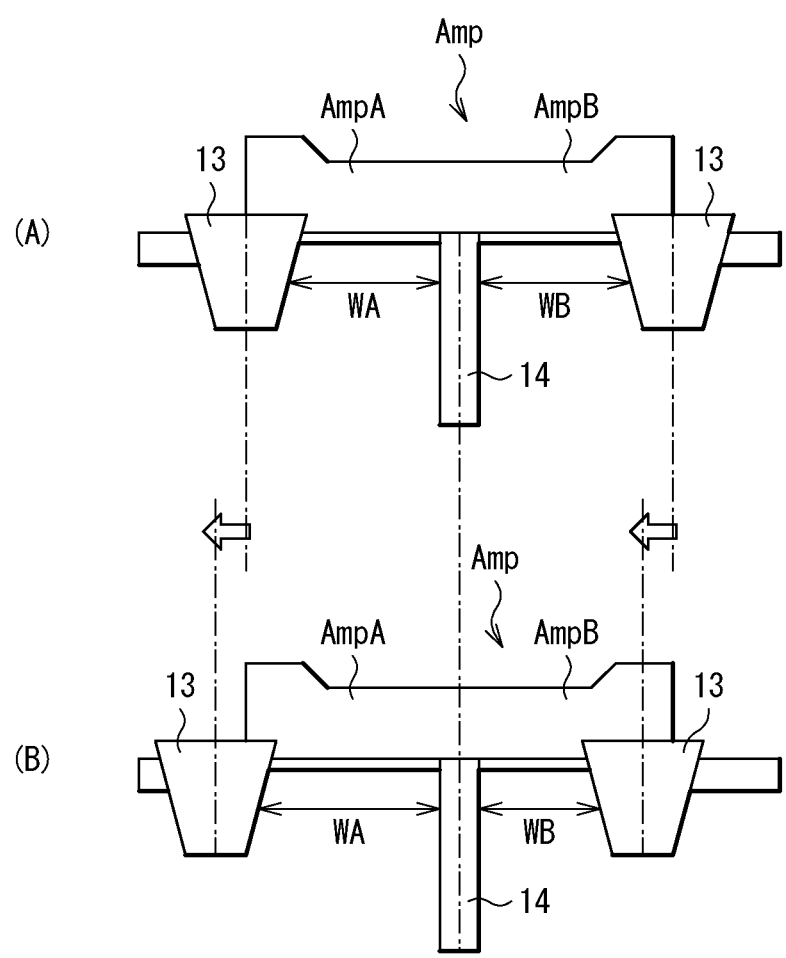
FIG. 20 is an explanatory view of pixel transistors arranged in parallel between adjacent pixels.

As described above, in the present embodiment, the pixel transistors are arranged in parallel between the adjacent pixels, and the gates of the respective pixel transistors are shared between the pixels. Therefore, for example, as illustrated in FIG. 20, even when formation positions of the element separation sections 13 are shifted for formation, for example, from (A) to (B), it is possible to cancel out the positional shifting of the element separation sections 13 with a channel length WA of the amplification transistor (AmpA) and a channel length WB of the amplification transistor (AmpB), for example, which are arranged in parallel. That is, it is possible to reduce dispersion in element characteristics between adjacent pixels due to the positional shifting upon the formation of the element separation section 13 and the element separation section 14. It is to be noted that the schematic cross-sectional view illustrated in FIG. 20 indicates a cross-section taken along a line X-X illustrated in FIG. 18.

In addition, arranging gates of the transistors across the element separation section 14 between pixels and sharing the gates between the adjacent pixels eliminate the need of a space for separating the adjacent gates, thus making it possible to further improve the area efficiency.

Figure 21:
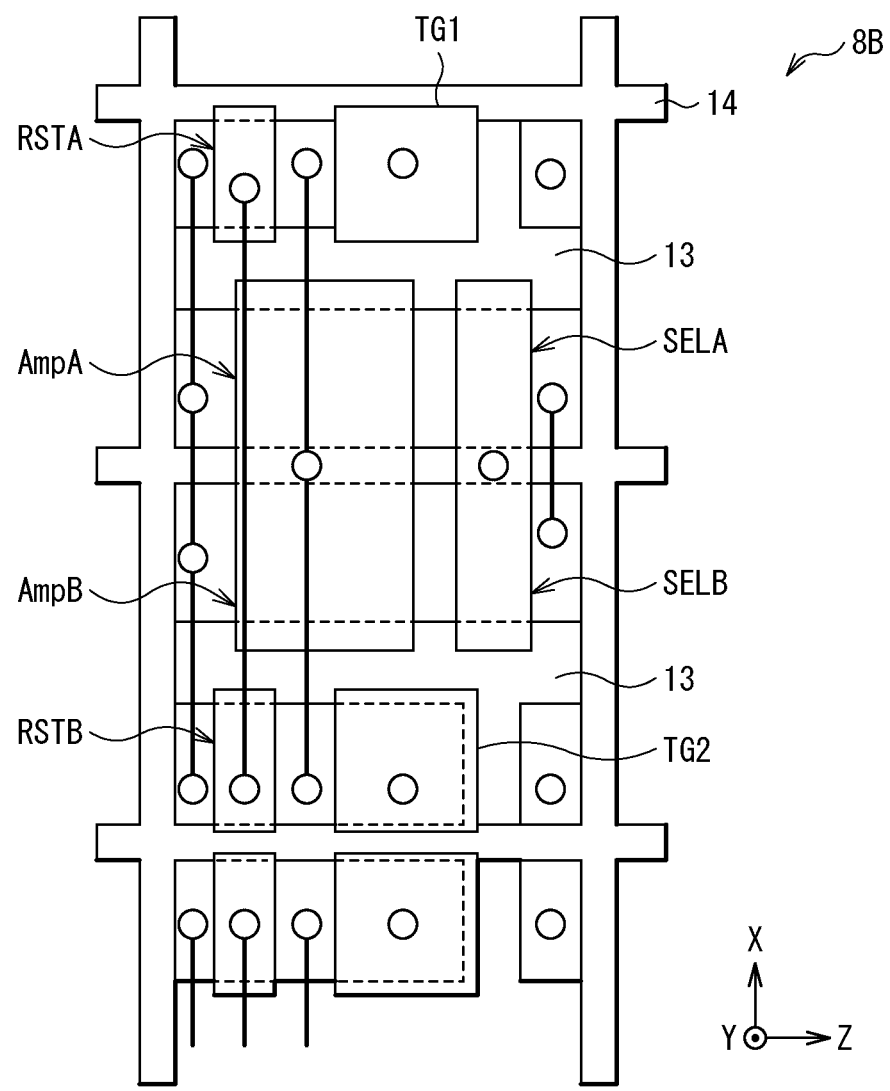
FIG. 21 is a schematic plan view of another example of the solid-state imaging element according to the second embodiment of the present disclosure.

In addition, the example is given, for the solid-state imaging element 8A illustrated in FIG. 18, in which the gates of the pixel transistors adjacently arranged between the adjoining pixels are formed across the pixels to thereby parallelize the pixel transistors provided in the respective pixels P; however, this is not limitative. For example, as in a solid-state imaging element 8B illustrated in FIG. 21, parallelization may be achieved by coupling pixel transistors arranged at distant positions using a wiring line. Further, FIG. 18 illustrates the example in which the gates of three transistors: the reset transistor (RST), the amplification transistor (AMP) and the selection transistor (SEL) are shared; however, this is not limitative. For example, the transfer transistor (TG) may be further shared.

4. Modification Example

4-1. Modification Example 7

Figure 22:
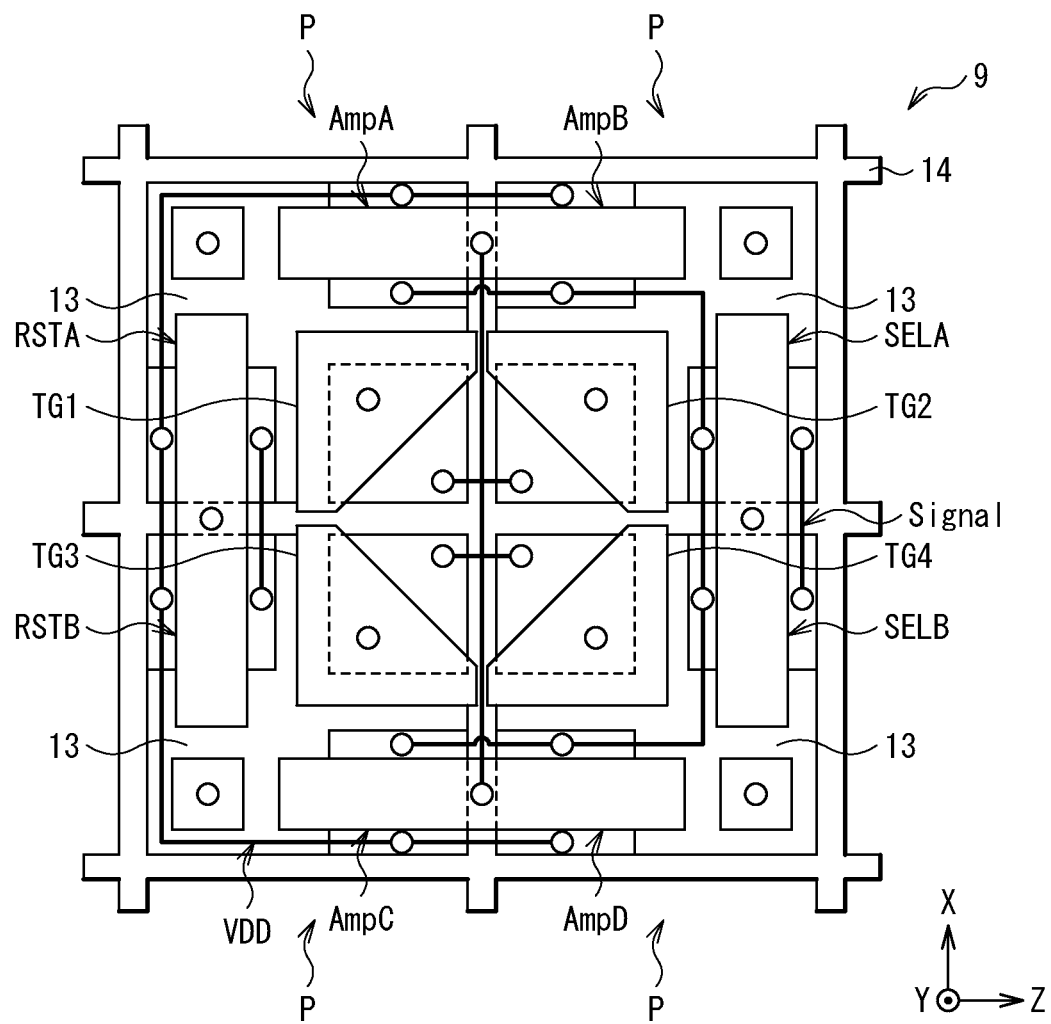
FIG. 22 is a schematic plan view of a solid-state imaging element according to Modification Example 7 of the present disclosure.
Figure 23:
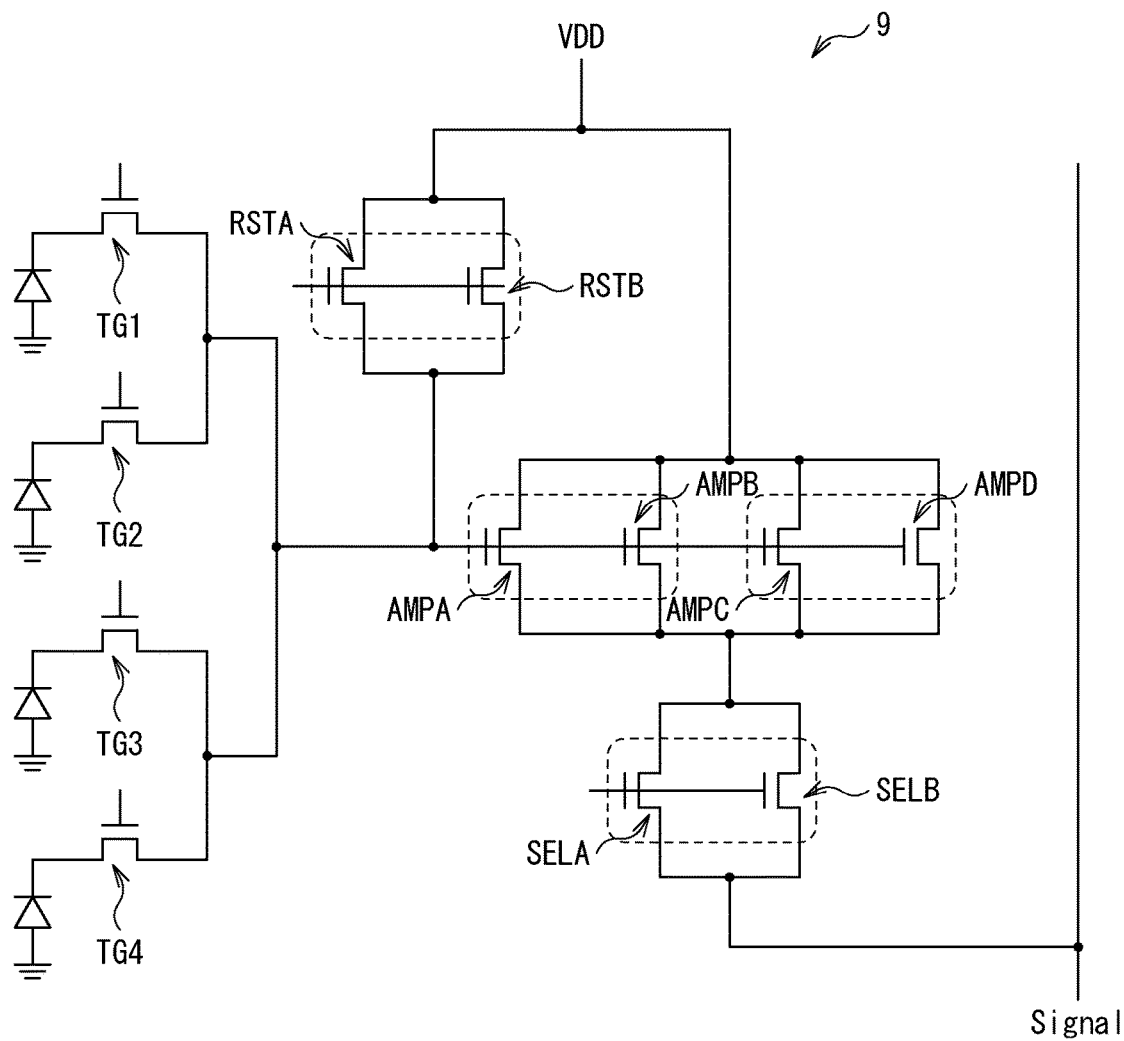
FIG. 23 is an equivalent circuit diagram of the solid-state imaging element illustrated in FIG. 22.

FIG. 22 schematically illustrates a planar configuration of a solid-state imaging element (a solid-state imaging element 9) according to Modification Example 7 of the present disclosure. FIG. 23 illustrates an equivalent circuit of the solid-state imaging element 9 illustrated in FIG. 22. In the solid-state imaging element 9 of the present modification example, as illustrated in FIG. 23, various pixel transistors are parallelized between four pixels P arranged in 2×2 columns. In this manner, the parallelization of the pixel transistors between the adjacent pixels may be achieved not only in a uniaxial direction (e.g., X-axis direction) as in the foregoing second embodiment, but may be achieved also in other directions (e.g., Z-axis direction).

5. Application Examples

Application Example 1

Figure 24:
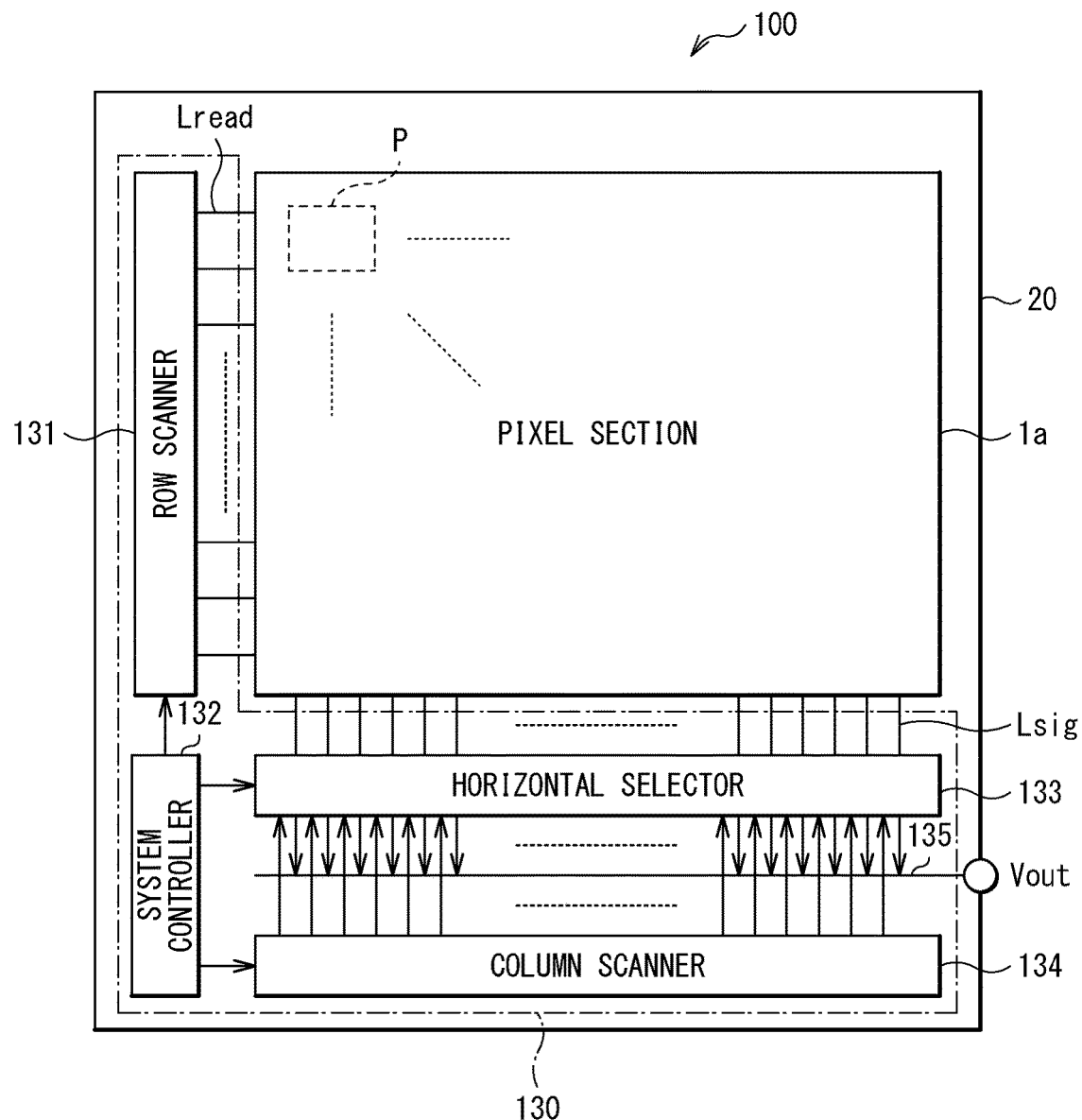
FIG. 24 is a block diagram illustrating an overall configuration of a solid-state imaging device including the solid-state imaging element illustrated in FIG. 1.

FIG. 24 illustrates, for example, an overall configuration of the solid-state imaging device 100 in which the solid-state imaging element 1 (or each of the solid-state imaging elements 2 to 9) described in the foregoing embodiment, etc. is used for each pixel. The solid-state imaging device 100 is a CMOS imaging sensor. The solid-state imaging device 100 includes a pixel section 1a as an imaging area on a semiconductor substrate 21, and includes, for example, a peripheral circuit section 130 configured by a row scanner 131, a horizontal selector 133, a column scanner 134, and a system controller 132 in a peripheral region of the pixel section 1a.

The pixel section 1a includes, for example, a plurality of unit pixels P (corresponding to, e.g., the solid-state imaging element 1) arranged two-dimensionally in matrix. To the unit pixels P, for example, pixel drive lines Lread (specifically, row selection lines and reset control lines) are wired on a pixel-row basis, and vertical signal lines Lsig are wired on a pixel-column basis. The pixel drive line Lread transmits a drive signal for reading of a signal from the pixel. One end of the pixel drive line Lread is coupled to an output terminal corresponding to each row in the row scanner 131.

The row scanner 131 is configured by a shift register, an address decoder, etc. The row scanner 131 is, for example, a pixel driver that drives the respective unit pixels P in the pixel section 1a on a row-unit basis. Signals outputted from the respective unit pixels P in the pixel row selectively scanned by the row scanner 131 are supplied to the horizontal selector 133 via the respective vertical signal lines Lsig. The horizontal selector 133 is configured by an amplifier, a horizontal selection switch, etc., that are provided for each vertical signal line Lsig.

The column scanner 134 is configured by a shift register, an address decoder, etc. The column scanner 134 sequentially drives the respective horizontal selection switches in the horizontal selector 133 while scanning the respective horizontal selection switches in the horizontal selector 133. As a result of the selective scanning by the column scanner 134, signals of the respective pixels to be transmitted via the respective vertical signal lines Lsig are sequentially outputted to horizontal signal lines 135, and are transmitted to the outside of the semiconductor substrate 21 through the horizontal signal lines 135.

A circuit part configured by the row scanner 131, the horizontal selector 133, the column scanner 134, and the horizontal signal lines 135 may be formed directly on the semiconductor substrate 21, or may be arranged in an external control IC. Alternatively, the circuit part may be formed on another substrate coupled with use of a cable, etc.

The system controller 132 receives a clock, data instructing an operation mode, etc., that are supplied from the outside of the semiconductor substrate 21. The system controller 132 also outputs data such as internal information of the solid-state imaging device 100. The system controller 132 further includes a timing generator that generates various timing signals, and performs drive control of peripheral circuits such as the row scanner 131, the horizontal selector 133, and the column scanner 134 on the basis of the various timing signals generated by the timing generator.

Application Example 2

Figure 25:
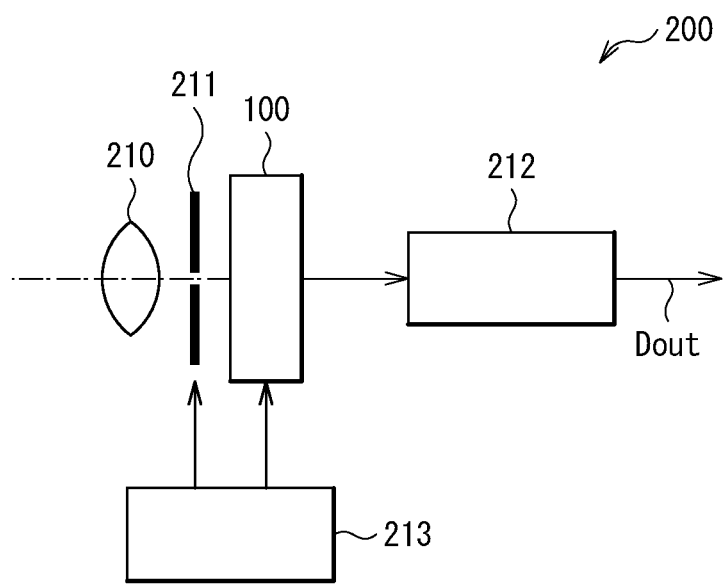
FIG. 25 is a functional block diagram illustrating an example of an imaging device (camera) using the solid-state imaging element illustrated in FIG. 24.

The above-described solid-state imaging device 100 is applicable to any type of electronic apparatus having an imaging function, for example, a camera system such as a digital still camera and a video camera, and a mobile phone having the imaging function. FIG. 25 illustrates an outline configuration of a camera 200 as an example thereof. This camera 200 is, for example, a video camera that is able to photograph a still image or shoot a moving image. The camera 200 includes, for example, the solid-state imaging device 100, an optical system (optical lens) 310, a shutter device 311, a drive section 313 that drives the solid-state imaging device 100 and the shutter device 311, and a signal processing section 312.

The optical system 310 guides image light (incident light) from a subject to the pixel section 1a in the solid-state imaging device 100. The optical system 310 may be configured by a plurality of optical lenses. The shutter device 311 controls periods of light irradiation and light shielding with respect to the solid-state imaging device 100. The drive section 313 controls a transfer operation of the solid-state imaging device 100 and a shutter operation of the shutter device 311. The signal processing section 312 performs various types of signal processing on a signal outputted from the solid-state imaging device 100. A video signal Dout after the signal processing is stored in a storage medium such as a memory, or outputted to a monitor, etc.

Application Example 3

<Example of Practical Application to In-Vivo Information Acquisition System>

Further, the technology according to an embodiment of the present disclosure (present technology) is applicable to various products. For example, the technology according to an embodiment of the present disclosure may be applied to an endoscopic surgery system.

Figure 26:
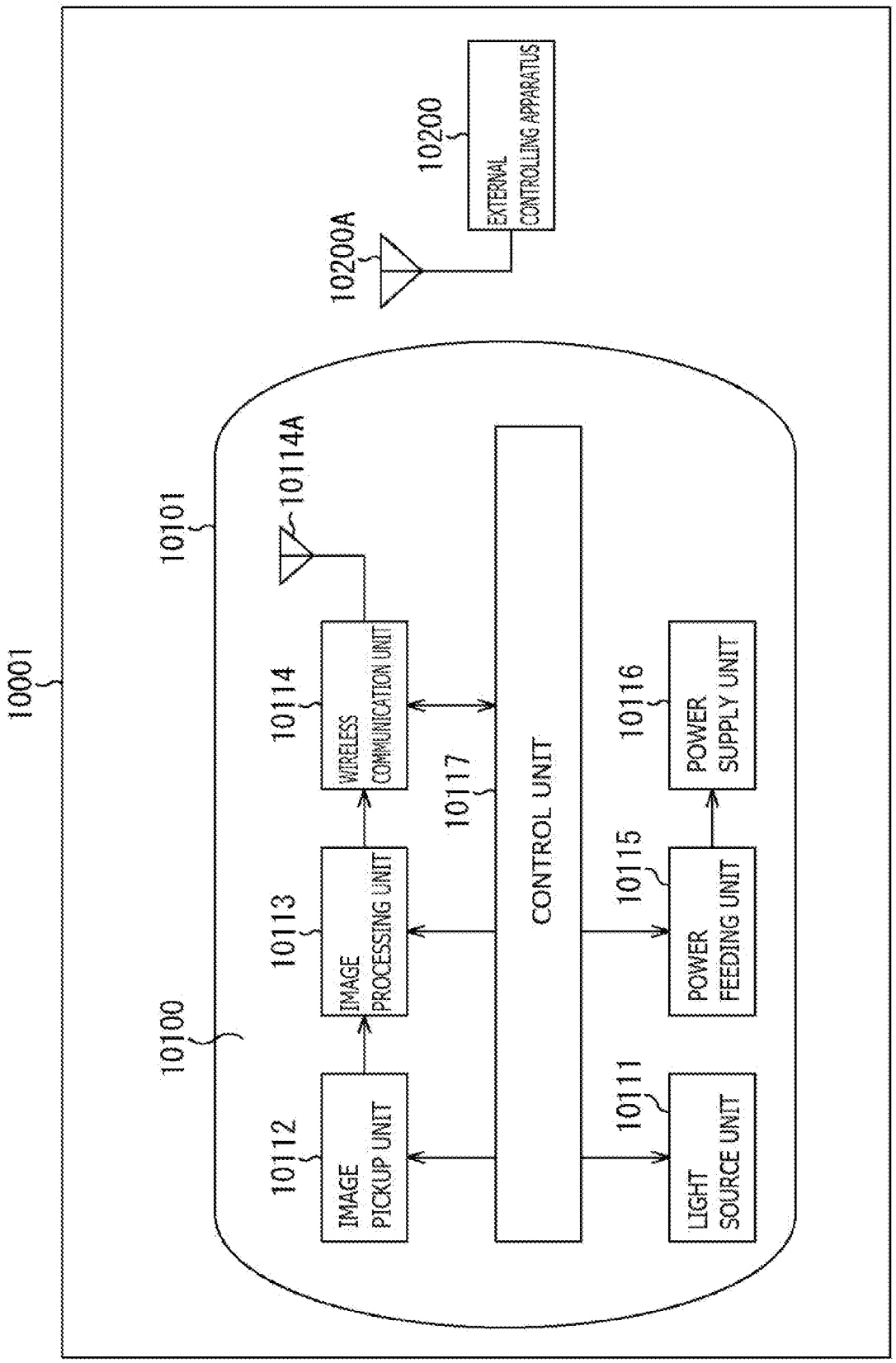
FIG. 26 is a block diagram depicting an example of a schematic configuration of an in-vivo information acquisition system.

FIG. 26 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 26, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

Application Example 4

<Example of Practical Application to Endoscopic Surgery System>

The technology according to an embodiment of the present disclosure (present technology) is applicable to various products. For example, the technology according to an embodiment of the present disclosure may be applied to an endoscopic surgery system.

Figure 27:
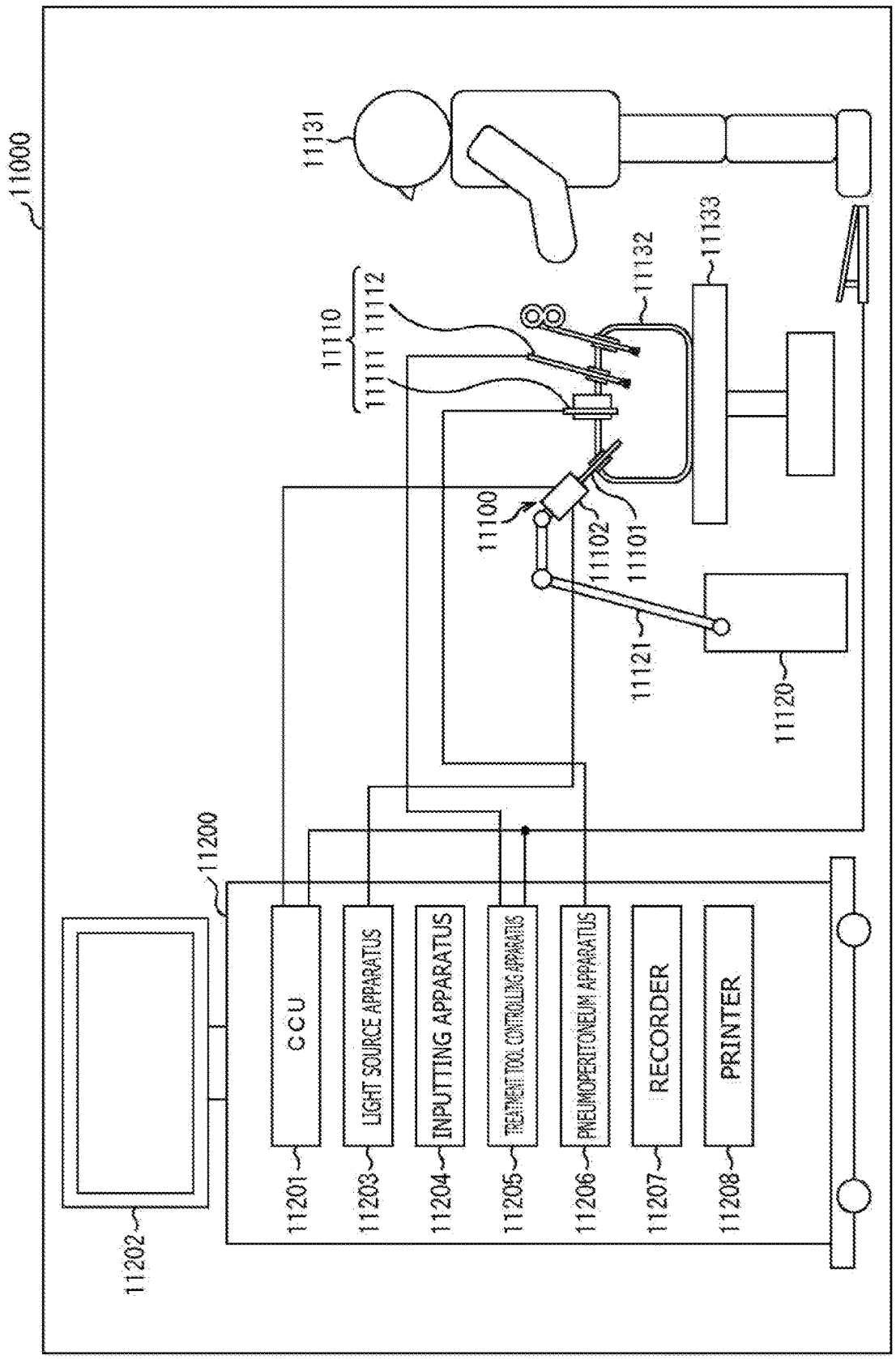
FIG. 27 is a view depicting an example of a schematic configuration of an endoscopic surgery system.

FIG. 27 is a view depicting an example of a schematic configuration of an endoscopic surgery system to which the technology according to an embodiment of the present disclosure (present technology) can be applied.

In FIG. 27, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumo-peritoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 28:
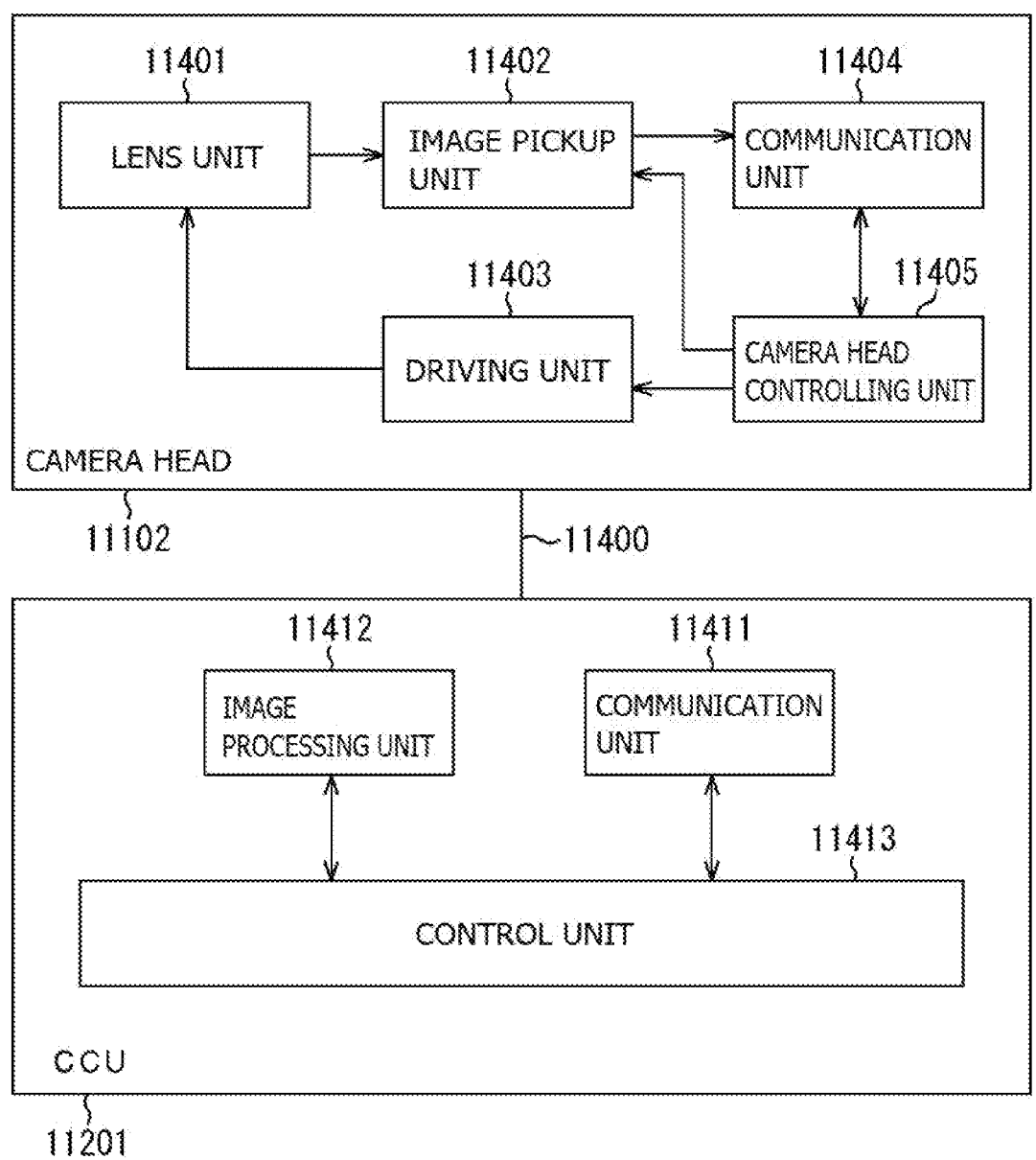
FIG. 28 is a block diagram depicting an example of a functional configuration of a camera head and a camera control unit (CCU).

FIG. 28 is a block diagram depicting an example of a functional configuration of the camera head 11102 and the CCU 11201 depicted in FIG. 27.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

Application Example 5

<Example of Practical Application to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

Figure 29:
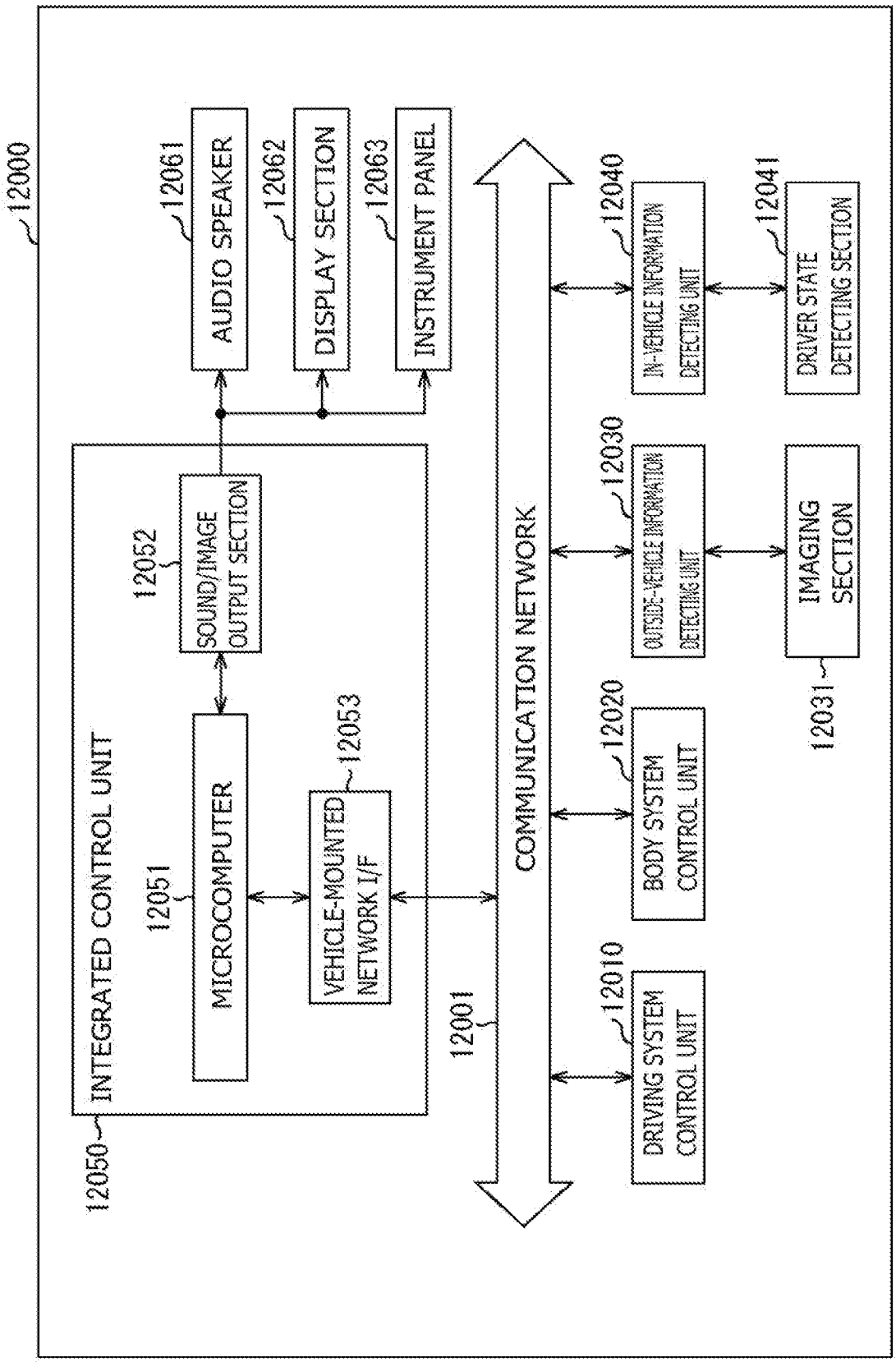
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
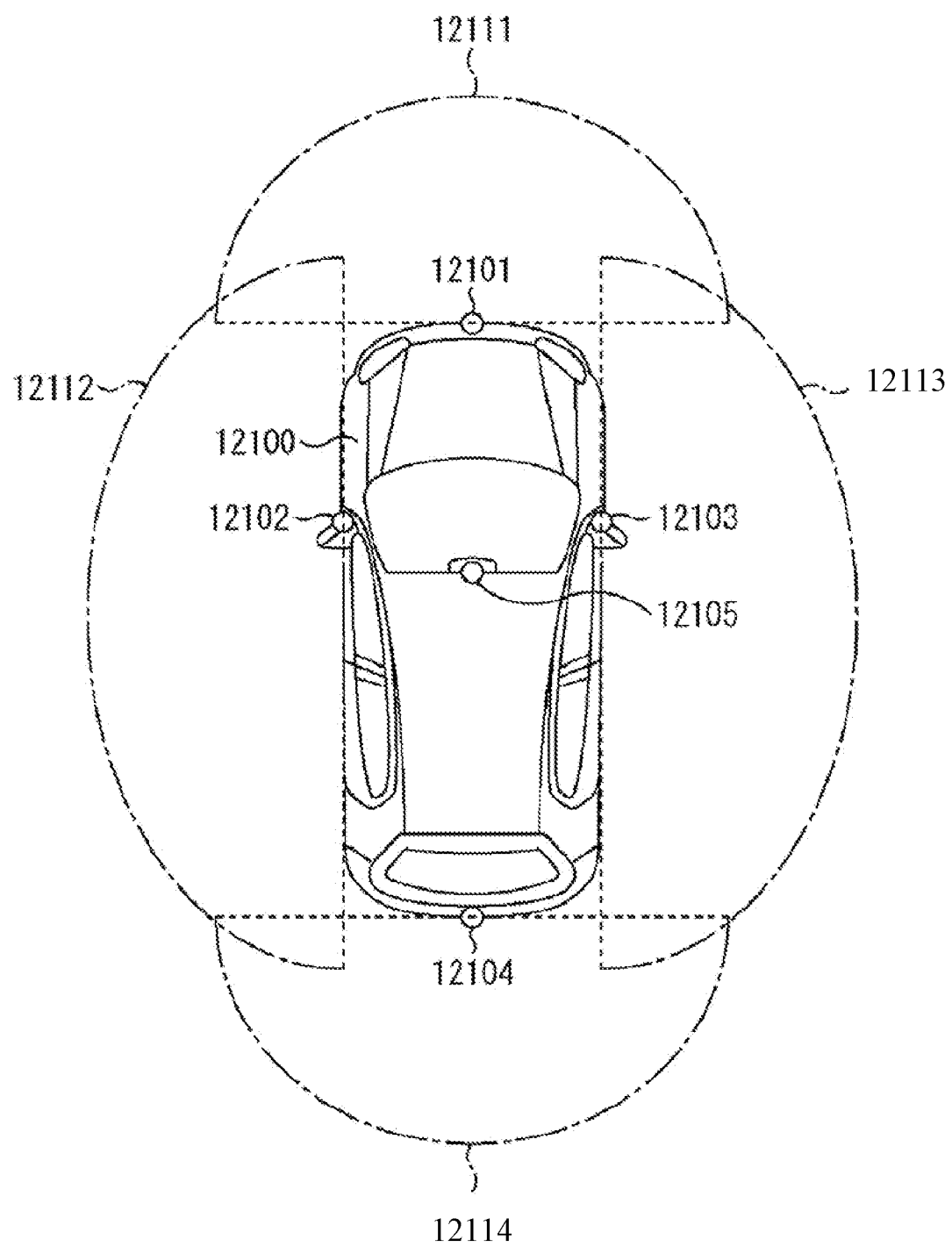
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove referring to the first and second embodiments and Modification Examples 1 to 7. However, the content of the present disclosure is not limited to the foregoing embodiment, etc. and may be modified in a wide variety of ways, and need not include all of the components described in the foregoing embodiment, etc. and may include any other component.

It is to be noted that the present disclosure may also have the following configurations.

(1)

A solid-state imaging element including:
  a semiconductor substrate including a photoelectric conversion section for each pixel;
  a pixel transistor provided on one surface of the semiconductor substrate; and
  an element separation section provided in the semiconductor substrate and including a first element separation section and a second element separation section that have mutually different configurations, the element separation section defining an active region of the pixel transistor,
  the second element separation section having, on a side surface, a first semiconductor region and a second semiconductor region that have mutually different impurity concentrations in a depth direction of the second element separation section.

(2)

The solid-state imaging element according to (1), in which
  the first element separation section and the second element separation section have mutually different depths, and
  the second element separation section is deeper than the first element separation section.

(3)

The solid-state imaging element according to (1) or (2), in which
  the second semiconductor region has a higher impurity concentration than the first semiconductor region, and the second semiconductor region is formed in a region corresponding to the photoelectric conversion section.

(4)

The solid-state imaging element according to any one of (1) to (3), in which the pixel transistor has a channel length that is defined by the first element separation section and the second element separation section.

(5)

The solid-state imaging element according to any one of (1) to (4), in which the first element separation section and the second element separation section are formed by an insulating film or an impurity region.

(6)

The solid-state imaging element according to any one of (1) to (5), in which the pixel transistor includes a transfer transistor, and
the transfer transistor includes a transfer gate extending to the photoelectric conversion section.

(7)

The solid-state imaging element according to any one of (1) to (6), in which the pixel transistor further includes a reset transistor, an amplification transistor, and a selection transistor, and
at least one of the reset transistor, the amplification transistor, or the selection transistor is arranged in parallel between adjacent pixels.

(8)

The solid-state imaging element according to (7), in which the pixel transistors arranged in parallel between the adjacent pixels are coupled by a wiring line.

(9)

An electronic apparatus including a solid-state imaging element, the solid-state imaging element including
a semiconductor substrate including a photoelectric conversion section for each pixel,
a pixel transistor provided on one surface of the semiconductor substrate, and
an element separation section provided in the semiconductor substrate and including a first element separation section and a second element separation section that have mutually different configurations, the element separation section defining an active region of the pixel transistor,
the second element separation section having, on a side surface, a first semiconductor region and a second semiconductor region that have mutually different impurity concentrations in a depth direction of the second element separation section.

This application claims the benefit of Japanese Priority Patent Application JP2018-133271 filed with the Japan Patent Office on Jul. 13, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light detecting device, comprising:
a semiconductor substrate including:
a first pixel;
a second pixel,
wherein the first pixel is adjacent to the second pixel;
a trench disposed through the semiconductor substrate; and
at least one transistor including a gate,
wherein the gate of the at least one transistor is disposed above one surface of the semiconductor substrate,
wherein the gate of the at least one transistor is shared by the first pixel and the second pixel,
wherein the gate of the at least one transistor is disposed directly above and covers a top portion of the trench in a cross-sectional view,
wherein the at least one transistor comprises a reset transistor, an amplification transistor, and a selection transistor, and
wherein at least one of the reset transistor, the amplification transistor, or the selection transistor is arranged in parallel with another of the reset transistor, the amplification transistor or the selection transistor provided between the first pixel and the second pixel.

2. A light detecting device, comprising:
a semiconductor substrate including:
a first pixel;
a second pixel,
wherein the first pixel is adjacent to the second pixel;
a trench disposed through the semiconductor substrate; and
at least one transistor including a gate,
wherein the gate of the at least one transistor is disposed above one surface of the semiconductor substrate,
wherein the gate of the at least one transistor is shared by the first pixel and the second pixel,
wherein the gate of the at least one transistor is disposed directly above and covers a top portion of the trench in a cross-sectional view,
wherein the at least one transistor comprises a reset transistor, an amplification transistor, and a selection transistor, and
wherein each of the reset transistor, the amplification transistor, and the selection transistor is arranged in parallel between the first pixel and the second pixel.

3. The light detecting device according to claim 1, further comprising an element separation section provided for each of the first pixel and the second pixel, wherein the element separation section is disposed through the semiconductor substrate.

4. The light detecting device according to claim 3, wherein the trench extends beyond the element separation section within the semiconductor substrate.

5. The light detecting device according to claim 3, wherein the element separation section and the trench have mutually different depths within the semiconductor substrate.

6. The light detecting device according to claim 3, wherein the at least one transistor has a channel length that is defined by the element separation section and the trench.

7. The light detecting device according to claim 3, wherein the element separation section and the trench are formed by an insulating film or an impurity region.

8. An electronic apparatus, comprising:
an optical system;
a light detecting device that receives light from the optical system, the light detecting device including:
a semiconductor substrate including:
a first pixel;
a second pixel, wherein the first pixel is adjacent to the second pixel;
a trench disposed through the semiconductor substrate; and
at least one transistor including a gate,
wherein the gate of the at least one transistor is disposed above one surface of the semiconductor substrate, wherein the gate of the at least one transistor is shared by the first pixel and the second pixel, wherein the gate of the at least one transistor is disposed directly above and covers at top portion of the trench in a cross-sectional view, wherein the at least one transistor comprises a reset transistor, an amplification transistor, and a selection transistor, and wherein at least one of the reset transistor, the amplification transistor, or the selection transistor is arranged in parallel with another of the reset transistor, the amplification transistor or the selection transistor provided between the first pixel and the second pixel; and a controller that processes signals from the light detecting device.

9. The electronic apparatus according to claim 8, wherein each of the reset transistor, the amplification transistor, and the selection transistor is arranged in parallel between the first pixel and the second pixel.

10. The electronic apparatus according to claim 8, further comprising an element separation section provided for each of the first pixel and the second pixel, wherein the element separation section is disposed through the semiconductor substrate.

11. The electronic apparatus according to claim 10, wherein the trench extends beyond the element separation section within the semiconductor substrate.

12. The electronic apparatus according to claim 10, wherein the element separation section and the trench have mutually different depths within the semiconductor substrate.

13. The electronic apparatus according to claim 10, wherein the at least one transistor has a channel length that is defined by the element separation section and the trench.

14. The electronic apparatus according to claim 10, wherein the element separation section and the trench are formed by an insulating film or an impurity region.

15. The light detecting device according to claim 2, further comprising an element separation section provided for each of the first pixel and the second pixel, wherein the element separation section is disposed through the semiconductor substrate.

16. The light detecting device according to claim 15, wherein the trench extends beyond the element separation section within the semiconductor substrate.

17. The light detecting device according to claim 15, wherein the element separation section and the trench have mutually different depths within the semiconductor substrate.

18. The light detecting device according to claim 15, wherein the at least one transistor has a channel length that is defined by the element separation section and the trench.

19. The light detecting device according to claim 15, wherein the element separation section and the trench are formed by an insulating film or an impurity region.

* * * * *